United States Patent
Smith et al.

(10) Patent No.: US 7,126,668 B2
(45) Date of Patent: Oct. 24, 2006

(54) APPARATUS AND PROCESS FOR DETERMINATION OF DYNAMIC SCAN FIELD CURVATURE

(75) Inventors: Adlai H. Smith, Escondido, CA (US); Robert O. Hunter, Jr., San Diego, CA (US)

(73) Assignee: Litel Instruments, San Diego, CA (US)

( * ) Notice: Subject to any disclaimer, the term of this patent is extended or adjusted under 35 U.S.C. 154(b) by 173 days.

(21) Appl. No.: 10/833,781

(22) Filed: Apr. 28, 2004

(65) Prior Publication Data

US 2005/0243294 A1    Nov. 3, 2005

(51) Int. Cl.
G03B 27/52    (2006.01)
G03B 27/42    (2006.01)

(52) U.S. Cl. .......................................... 355/55; 355/53

(58) Field of Classification Search .................. 355/55
See application file for complete search history.

(56) References Cited

U.S. PATENT DOCUMENTS

| | | | |
|---|---|---|---|
| 4,861,148 A | 8/1989 | Sato et al. .................. 350/505 |
| 5,285,236 A | 2/1994 | Jain ............................ 355/53 |
| 5,300,786 A | 4/1994 | Brunner et al. ............. 250/548 |
| 5,303,002 A | 4/1994 | Yan ............................. 355/53 |
| 5,402,224 A | 3/1995 | Hirukawa et al. | |
| 5,757,507 A | 5/1998 | Auschnitt et al. ........... 356/401 |
| 5,828,455 A | 10/1998 | Smith et al. ................ 356/354 |
| 5,936,738 A | 8/1999 | Liebmann et al. ......... 356/401 |
| 5,978,085 A | 11/1999 | Smith et al. ................ 356/354 |
| 6,639,651 B1 * | 10/2003 | Matsuyama ................. 355/52 |
| 6,724,464 B1 * | 4/2004 | Yang et al. .................. 355/55 |
| 6,906,303 B1 * | 6/2005 | Smith ..................... 250/208.1 |
| 6,961,115 B1 * | 11/2005 | Hamatani et al. ............. 355/52 |
| 6,963,390 B1 * | 11/2005 | Smith et al. .................. 355/55 |
| 2003/0095247 A1 | 5/2003 | Nakao | |
| 2003/0202174 A1 | 10/2003 | Smith et al. | |

FOREIGN PATENT DOCUMENTS

EP    0833 208 A2    1/1998

OTHER PUBLICATIONS

R. DeJule, "Mix-and-Match: A Necessary Choice", *Semiconductor International*, Feb. 2000, pp. 66-76.
R. DeJule, "A Look at Overlay Error", *Semiconductor International*, Feb. 2000, p. 52.
D. Cote et al., "Micrascan™ III Performance of a Third Generation, Catadioptric Step and Scan Lithographic Tool", *SPIE* vol. 3051, pp. 806-816.
J. Mulkens et al., "ArF Step and Scan Exposure System for 0.15 μm and 0.13 μm Technology Node?", *SPIE* vol. 3679, Mar. 1999, pp. 506-521.

(Continued)

*Primary Examiner*—W. B. Perkey
*Assistant Examiner*—Vivian Nelson

(57) ABSTRACT

A process for the determination of focal plane deviation uniquely due to the scanning dynamics associated with a photolithographic scanner is described. A series of lithographic exposures is performed on a resist coated silicon wafer using a photolithographic scanner. The lithographic exposures produce an array of focusing fiducials that are displaced relative to each other in a unique way. The resulting measurements are fed into a computer algorithm that calculates the dynamic scanning field curvature in an absolute sense in the presence of wafer height variation and other wafer/reticle stage irregularities. The dynamic scan field curvature can be used to improve lithographic modeling, overlay modeling, and advanced process control techniques related to scanner stage dynamics.

32 Claims, 21 Drawing Sheets

OTHER PUBLICATIONS

T.A. Brunner, "Impact of Lens Aberrations on Optical Lithography", pp. 1-9.

J. van Schoot et al., "0.7 NA DUV Step & Scan System for 150nm Imaging with Improved Overaly", *SPIE* vol. 3679, Mar. 1999, pp. 448-456.

H. G. Müller et al., "Large Area Fine Line Patterning by Scanning Projection Lithography", pp. 100-104.

J.E. Bjorkholm et al., "Reduction Imaging at 14nm Using Multilayer-Coated Optics: Printing of Features Smaller than 0.1 μm", *J. Vac. ci. Technol.* B 8 (6), Nov./Dec. 1990, pp. 1509-1513.

B. E. Newnam et al., "Development of XUV Projection Lithography at 60-80 nm", *SPIE* vol. 1671, 1992, pp. 419-427.

W. H. Press et al., "Numerical Recipes The Art of Scientific Computing", pp. 52-64.

C. P. Ausschnitt, "Distinguishing Dose from Defocus for In-Line Lithography Conrol", *SPIE* vol. 3677, Mar. 1999, pp. 140-147.

G. M. Pugh, "Detailed Study of a Phase-Shift Focus Monitor", *SPIE* vol. 2440, pp. 690-700.

J.W. Gemmink, "A Simple and Calibratable Method for the Determinationo f Optimal Focus", *SPIE* vol. 1088, 1989, pp. 220-230.

J. P. Kirk, "Astigmatism and Field Curvature from Pin-Bars", *SPIE* vol. 1463, 1991, pp. 282-291.

M. Terry et al., "Gauging the Performance of An In-Situ Interferometer".

M. Dusa et al., "Photo-Lithographic Lens Characterization of Critical Dimension Variation Using Empirical Focal Plane Modeling", *SPIE* vol. 3051, Mar. 13, 1997, pp. 1-10.

J. H. Bruning, "Optical Lithography—thirty Years and Three Orders of Magnitude", *SPIE* vol. 3051, pp. 14-27.

"Quaestor Q7 Brochure", *Bio-Rad Semiconductor Systems*.

B. Lin, "The attenuated Phase-Shifting Mask", *Solid State Technology*, Jan. 1992, pp. 43-47.

T.A. Brunner et al., "Quantitative Stepper Metrology using the Focus Monitor Test Mask", *SPIE*, vol. 2197, pp. 541-549.

N. M. Ceglio et al., "Soft X-Ray Projection Lithography", *J. Vac. Sci. Technol.* B 8 (6), Nov./Dec. 1990, pp. 1325-1328.

H. R. Huff et al., "Competitive Assessment of 200 mm Epitaxial Silicon Wafer Flatness", *SPIE* vol. 3332, pp. 625-630.

P. Dirksen et al., "Latent Image Metrology for Production Wafer Steppers", *SPIE* vol. 2440, pp. 701-711.

International Technology Roadmap for Semiconductors, 2001 Edition, *SEMATECH*, pp. 1-21.

G. Davies et al., "193 nm Step and Scan Lithography", pp. 1-15.

S. D. Hsu et al., "Controlling Focal Plane Tilt", pp. 1-5.

R.D. Mih et al., Using the Focus Monitor Test Mask to Characterize Lithographic Performance, *SPIE*, vol. 2440, pp. 657-665.

International Search Report and The Written Opinion of the International Searching Authority for PCT/US2005/012496 dated May 11, 2006, 12 pgs.

* cited by examiner

|AE| |AF| |AG| |AH| |AI|   j = +3   irow = 7

|Z| |AA| |AB| |AC| |AD|   +2   6

|U| |V| |W| |X| |Y|   +1   5   ↕ Scan direction

|P| |Q| |R| |S| |T|   0   4   ↑ YW → XW

|K| |L| |M| |N| |O|   -1   3

|F| |G| |H| |I| |J|   -2   2   ⎤
⊢ P/M ⊣                         ⎥ P/M
|A| |B| |C| |D| |E|   -3   1   ⎦

-2   -1   0   +1   +2 = i
 1    2   3    4    5 = icol

Figure 20

APPARATUS AND PROCESS FOR DETERMINATION OF DYNAMIC SCAN FIELD CURVATURE

BACKGROUND OF THE INVENTION

1. Field of the Invention

The present invention relates generally to processes for semiconductor manufacturing and, more particularly, to optical lithography techniques for the determination of focal plane deviation (FPD) associated with photolithographic projection systems.

2. Description of the Related Art

Semiconductor manufacturers and lithography tool vendors have been forced to produce higher numerical aperture (NA) lithography systems (steppers or scanners) using smaller wavelengths (for example, 193 nm DUV lithography) in response to the semiconductor industry's requirement to produce ever-smaller critical features. See, for example, the statement of the well-known "Moore's Law" at "Cramming more components onto integrated circuits", G. Moore, *Electronics, Vol.* 38, No. 8, 1965. The ability to produce (manufacture) sub-wavelength features can often be determined by considering the rather simple (3-beam) Rayleigh scaling Resolution (R) and (Reference A) Depth-of-Focus (DoF) equations; $\sim\lambda/2NA$ and $\sim\lambda/2NA^2$ respectively. These coupled equations stress the inverse relationship between resolution and DoF based on the exposure wavelength ($\lambda$ and numerical aperture (NA) for features printed near the limit of the optical system. High NA lithography has led to improved resolution and a reduction in the overall focus budget, making lithography processes difficult to control. See "Distinguishing dose from defocus for in-line lithography control", C. Ausschnitt, *SPIE*, Vol. 3677, pp. 140–147, 1999; and "Twin Scan 100 Product Literature", ASML). Poor lithographic process control (focus and exposure) leads to smaller product yields, increased manufacturing costs, and poor time to market. While semiconductor lithographers have discovered creative reticle enhancement techniques (RETs) and other optical techniques (PSM) to increase the useable DoF—the problem remains. See, for example, "The Attenuated Phase-Shifting Mask", B. Lin, and "Method and Apparatus for Enhancing the Focus Latitude in Lithography", Pei-Yang Yan, U.S. Pat. No. 5,303,002, Apr. 12, 1994. Therefore, it is crucial to monitor focus during photolithographic processing and develop new methods for focus control. Typically focus error across a scanner field can be attributed to the following three factors: 1) wafer and reticle non-flatness, 2) dynamic wafer/reticle stage error, and 3) static and/or dynamic lens field curvature. For a photolithographic scanner, dynamic field curvature varies in the cross scan direction (x) in rather complex ways.

The ability to precisely control the photolithographic scanner tool depends on the ability to determine the magnitude and direction of the individual focusing error components (items 1–3 above) and to account for repeatable and non-repeatable portions of those errors. While focusing error causes reduction in image fidelity, the coupling of focus error and other lens aberrations (distortions) degrades overlay or positional alignment as well. See, for example, "Impact of Lens Aberrations on Optical Lithography", T. Brunner.

Over the past 30 years the semiconductor industry has continued to produce faster (via smaller critical features) and more complex (greater functionality, dense patterning) circuits, year after year. See, for example, "Optical Lithography—Thirty years and three orders of magnitude", J. Brunning, *SPIE*, Vol. 3051, pp. 14–27, 1997; and "Cramming more components onto integrated circuits", supra. The push to smaller feature sizes is gated by many physical limitations. See "Introduction to Microlithography", L. Thompson et al., *ACS 2nd Edition*, p. 69, 1994. As the critical dimensions of semiconductor devices approach 50 nm, the usable DoF will approach 100 nm. See "2001 ITRS Roadmap", SEMATECH, pp. 1–21). Continued advances in lithography equipment (higher NA systems, smaller wavelength exposure sources), RET's, resist processing, and automated process (focus and exposure) control techniques will get more difficult and remain critical. See, for example, "2001 ITRS Roadmap", supra; and "The Waferstepper Challenge: Innovation and Reliability despite Complexity", Gerrit Muller, *Embedded Systems Institute Netherlands*, pp. 1–11, 2003. Finally, while FPD deviation can be determined using a variety of methods, none of these methods have the ability to divide the focal error into correctable (possibly systematic) and non-correctable (possibly random) portions—especially for scanners and to further decouple the effects of wafer flatness. The ability to decouple focus error leads directly to improved dynamic scanning behavior using a variety of advanced process control techniques. See "Predictive process control for sub-0.2 um lithography", T. Zavecz, *SPIE ML*, Vol. 3998–48, pp. 1–12, 2000; "TWIN-SCAN 1100 Product Literature", supra; and "Advanced statistical process control: Controlling sub-0.18 µm Lithography and other processes", A. Zeidler et al., *SPIE*, Vol. 4344, pp. 312–322, 2001.

It should be noted that, even if a perfect lens with no dynamic lens field curvature (ZL=0) could be obtained, the lens could still be associated with FPD due to scanner dynamic focal plane deviation (SFPD), which is the scanner field curvature error associated with stage synchronization error in the Z direction. Thus, in view of the industry trends described above, more precise techniques for determining FPD and SFPD are continuously desired.

FPD: There are a number of methods that with greater or lesser accuracy measure defocus or focal plane deviation (FPD) over an exposure field. In general terms, each of these techniques estimate the focal error across the field using a variety of special reticle patterns (focusing fiducials, FF), interferometric devices, mirrors, sensors, and statistical models. In addition, each of these methods utilizes the stepper or scanner wafer stage leveling and positioning system and/or optical alignment system to aid in the determination of FPD. See, for example, "TWINSCAN 1100 Product Literature", supra. The term "FPD" is a rather general term describing the complete focus error associated with the photolithographic stepper or scanner, deviations from the focal plane in reference to the wafer surface. Among other things, FPD can be caused by lens tilt, stage/reticle tilt, reticle bow, lens field curvature, and stage synchronization error. FIG. 7 shows a generic photolithographic leveling system. FIG. 8 illustrates some common reticle patterns (e.g. IBM's Phase Shift Focus Monitor (PSFM), and ASML's FOCAL alignment mark) that are used to determine FPD for both steppers and scanners. Typically, FPD calibration/monitoring is performed daily or at least weekly to ensure that the stepper or scanner is operating within design limits (verifying the focus system works, the stage is level, etc.). While both techniques are widely accepted both techniques require complex calibrations to be performed at each field point. See "Detailed Study of a Phase-Shift Focus Monitor", G. Pugh et al., *SPIE* Vol. 2440, pp. 690–700, 1995; and "FOCAL: Latent Image Metrology for Production Wafer Steppers", P. Dirksen et al., *SPIE*, Vol. 2440, p. 701, 1995).

Table 1 below lists some FPD prior art methods:

TABLE 1

| Method | Measurement Type | Comment |
| --- | --- | --- |
| ISI (See "Apparatus, Method of Measurement and Method of Data Analysis for Correction of Optical System", A. Smith et al., U.S. Pat. No. 5,828,455 issued Oct. 27, 1998 and "Apparatus, Method of Measurement and Method of Data Analysis for Correction of Optical System", A. Smith et al., U.S. Pat. No. 5,978,085 issued Nov. 2, 1999) | Absolute | Extremely accurate. |
| FOCAL (See "FOCAL: Latent Image Metrology for Production Wafer Steppers", supra) | Relative | Published version claims high absolute accuracy, resolution averaging in practice. |
| IBM focus monitor (See "Optical Focus Phase Shift Test Pattern, Monitoring System and Process", T. Brunner et al., U.S. Pat. No. 5,300,786 issued Apr. 5, 1994) | Absolute | Requires 'calibration'. It is very process independent. |
| Schnitzl (See "Distinguishing Dose from Defocus for In-Line Lithography Control", supra) | Relative with one exposure | Complex calibration, varying target sensitivity. |
| TIS (See "193 Step and Scan Lithography", G. Davies et al., Semi Tech Symposium, Japan, 1998; and "Twin Scan 1100 Product Literature", supra) | Relative | Relies on wafer Z-stage, accuracy/repeat. |

ISI (Litel): A method for determining the aberrations of an optical system is described in U.S. Pat. No. 5,828,455, supra, and U.S. Pat. No. 5,978,085, supra. Where a special reticle is used to determine the Zernike coefficients for photolithographic steppers and scanners. Knowing the wavefront aberration (Zernike coefficients and the associated polynomial) associated with the exit pupil of the projection system includes information about the lens field curvature or focus (Zernike coefficient a4, for example). Smith uses a special reticle and a self-referencing technique to rapidly identify FPD to a high degree of accuracy, determines focusing errors to ~5 nm, in the presence of scanner noise. This method automatically determines lens field curvature information for both static and dynamic exposure tools (steppers and scanners).

PSFM: A method (Phase Shift Focus Monitor) described in U.S. Pat. No. 5,300,786, supra, can be used to determine and monitor the focal plane deviation (FPD) associated with the lithographic process. More information can be found in "Detailed Study of a Phase-Shift Focus Monitor", supra. In general, an alternating PSM with phase close to 90° possesses unusual optical properties that can be exploited to measure focus errors. See, for example, "Quantitative Stepper Metrology Using the Focus Monitor Test Mask", T. Brunner et al., *SPIE*, Vol. 2197, pp. 541–549; and "Using the Focus Monitor Test Mask to Characterize Lithographic Performance", R. Mih et al., *SPIE*, Vol. 2440, pp. 657–666, 1995. It is possible to design a "box-in-box" overlay target using a phase shift mask pattern (referred to here as a focusing fiducial; see FIGS. 8–9), in which the measured overlay error is proportional to the focus error (see FIG. 10). Focal plane non-flatness is then determined by measuring the focusing fiducials across the lens field. Astigmatism information appears as differences between the delta-X overlay error and the delta-Y overlay error measurement. This technology has also been used for assessing variations in focus across the wafer due to lens heating, misfocusing near the edge of the wafer, and chuck/stage non-flatness. One major drawback with the PSFM method is that a fairly elaborate calibration procedure (focus offset vs. overlay shift for each field point) is required before it can be used, the PSFM technique is rather sensitive to the source-sigma (Na-source/Na-objective) that varies from process to process. Additional PSM techniques, such as those found in "Monitor for Alternating Phase Shift Masks", L. Liebmann et al., U.S. Pat. No. 5,936,738 issued Aug. 10, 1999, are used in a similar way. While the PSFM method provides an FPD map across a scanner or stepper field it does not provide a method for determining the dynamic lens field curvature independent of wafer height variation in the presence of stage synchronization error. See, for example, "Comprehensive Focus-Overlay-CD Correlation to Identify Photolithographic Performance", Dusa et al., *SPIE*, Vol. 2726–29, 1996.

FOCAL: A method (FOCAL—Focus determination using stepper alignment system) described by P. Dirksen, et. al., *SPIE*, Vol. 2440, 1995, p. 701, specifies a focusing fiducial that can be used to find FPD and astigmatism across the exposure field (lens). FOCAL alignment marks (focusing fiducials) consist of modified wafer alignment marks that are measured using the stepper wafer alignment subsystem. See, for example, FIG. 1 of "FOCAL: Latent Image Metrology for Production Wafer Steppers", P. Dirksen et al., *SPIE*, Vol. 2440, p. 701, 1995. Defocus of the tool results in an apparent shift of the center of the alignment mark relative to that of the 'best focus' position. The FOCAL technique makes use of the exposure tool's alignment mechanism and therefore requires that the stepper or scanner be off-line for the length of the measurement sequence. FOCAL marks are sensitive to exposure and sigma like the PSFM method; however, since fiducial response is a function of pitch, the target features are less dependent upon reticle error. Furthermore, the FOCAL data (focus vs. overlay error) must be calibrated for every point in the exposure field similar to phase-shift monitors (typically at 121 points across an exposure field, see FIG. 10). Now, it is possible to use FOCAL to separate out lens tilt and astigmatism from dynamic FPD maps and provide a dynamic focal plane map, but wafer height variation and stage synchronization errors would still be included in the result. See, for example, "193 Step and Scan Lithography", supra; and "Comprehensive Focus-Overlay-CD Correlation to Identify Photolithographic Performance", supra.

Schnitzl Targets: A method described by Ausschnitt in "Distinguishing Dose from Defocus for In-Line Lithography Control", C. Ausschnitt, *SPIE*, Vol. 3677, pp. 140–147, 1999, makes use of line-end shortening effects to decouple focus drift from exposure drift on semiconductor product wafers. FIG. 9 shows a typical pair of Schnitzl targets (focusing fiducials). It is widely known that resist line-ends (FIG. 9) are very sensitive (exhibit greater line-end shortening) to both focus and exposure drifts; the effect is further enhanced as the lithographic process is pushed near performance limit of the scanner tool (~$\lambda$/2NA). Using the Schnitzl targets and a fairly elaborate method of calibration (CD-SEM measurements and a coupled system of equations) Ausschnitt offers a method that can determine the magnitude of focus drift on product wafers using one or more exposures in the presence of exposure drift (see FIG. 10 for example results). Since changes in focus and exposure can produce similar changes in the critical dimension (CD) the Schnitzl method is useful for day-to-day process monitoring because it eliminates the need to constantly perform focus and exposure experiments (FEM—a Focus Exposure Matrix) in-between production runs. In addition, the method uses fast and accurate optical overlay tools to measure the Schnitzl patterns (in several forms, CD targets or Overlay targets, FIGS. 8–9) after wafer processing, this saves monitoring costs because optical overlay tools are less expensive to operate as compared with a CD-SEM. While decoupling focus drift from exposure drift is useful for process monitoring, the method in its present form requires two exposures at different focus settings to determine the absolute focal drift (direction). Performing extra exposures during production runs is very costly. In addition, since the initial Schnitzl target calibration procedure depends on a number of lithographic tool settings (line size, pitch, sigma, NA) re-calibration is required for each lithographic process change—including changes in metrology tools. The Schnitzl focusing fiducials are often used to map out FPD across a stepper or scanner field, but methods similar to those described in "Comprehensive focus-overlay-CD correction to identify photolithographic performance", Dusa, et al., *SPIE* Vol. 2726–29, 1996, would need to be implemented to obtain a dynamic focus map—but again, wafer height variation and scanning dynamics are not considered.

Summarizing:

Several methods for determining FPD have been described. Common to all of these methods is that a feature (focusing fiducial or FF) is printed on a wafer and the focusing fiducial is subsequently measured. The data from the focusing fiducial is processed and an FPD value, δZ, is determined. Further, and common to all these methods, the contributions of wafer height, lens aberrations (in the form of lens field curvature), and stage synchronization are not resolved into their distinct components.

SUMMARY

In accordance with the present invention, a process for the proper determination of SFPD in the presence of wafer height variation, ZW(x, y), is described.

A series of lithographic exposures is performed on a resist coated silicon wafer using a photolithographic scanner. The lithographic exposures produce an array of focusing fiducials that are displaced relative to each other in a unique way. The focusing fiducials are measured and the FPD computed. The resulting measurements are fed into a computer algorithm that calculates the dynamic scanning field curvature in an absolute sense in the presence of wafer height variation and other wafer/reticle stage irregularities. Alternative embodiments of the preferred embodiment allow for the determination of dynamic scanning field curvature for scanning systems with asymmetric exposure fields.

Other features and advantages of the present invention should be apparent from the following description of the preferred embodiment, which illustrates, by way of example, the principles of the invention.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction the accompanying drawings in which:

FIG. 20 shows a schematic of the first exposure for an NX=5 by NY=7 array of focusing fiducials.

DETAILED DESCRIPTION

Dynamic Focal Plane Deviation

Figure 1:
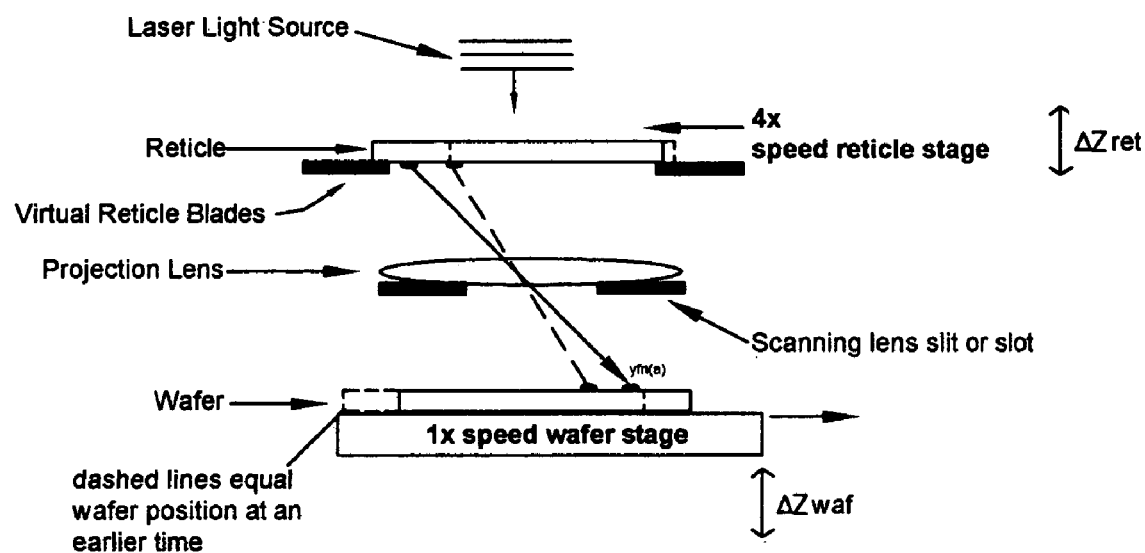
FIG. 1 shows photolithographic scanner system.

It is desired to determine the performance of Scanner dynamic Focal Plane Deviation (SFPD) resulting from the imperfect synchronization of the wafer and reticle stages due to their mutual motion in the Z direction as the scanner operates. FIG. 1 is a schematic diagram of a scanner system constructed in accordance with the invention. FIG. 1 shows a scanner and motion of the reticle (ΔZ ret) and wafer (ΔZ waf) perpendicular to the scanning direction as responsible for what shall be referred to as "dynamic scanning field curvature" or "dynamic scan FPD" or simply "SFPD". The SFPD is the deviation in net focus at the wafer plane that is attributable to the wafer height sensors and adjusters, independent from other dynamic focal errors such as dynamic lens field curvature, reticle/wafer stage irregularity (bow and warp), and wafer height variations. Thus, the invention is directed to a process for the proper determination of SFPD in the presence of wafer height variation, ZW(x, y).

Figure 5:
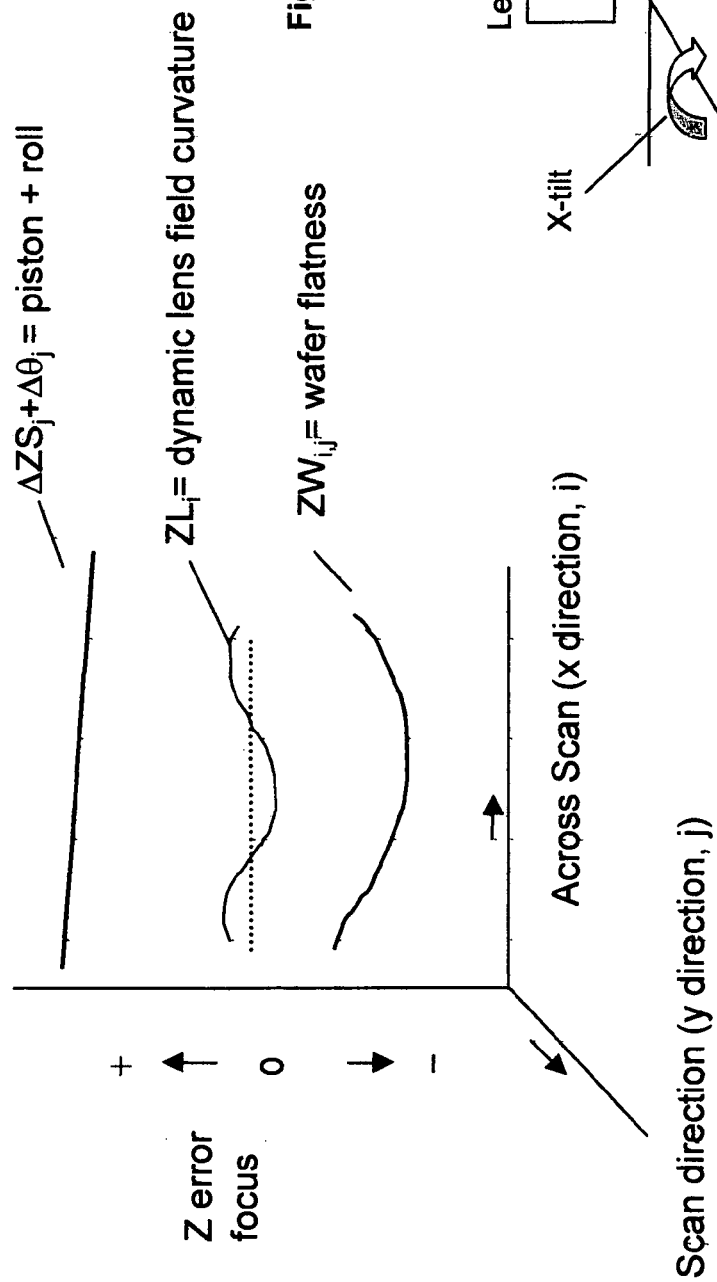
FIG. 5 shows focus error components for the scanner, wafer, and lens.

The term δZ (x, y) is defined as the net focal deviation or focal plane deviation (FPD) at a wafer plane located at (x, y). This can be determined a variety of ways, as described below. We can decompose δZ(x, y) into contributions from the lens, the scan, and the wafer as:

$$\delta Z(x,y) = ZL(x) + ZS(y) + x*\theta(y) + ZW(x,y) \qquad \text{(Equation 1)}$$

where we use a continuous field position (x, y) and:

ZL(x)=dynamic lens field curvature=contribution from lens. This is typically known to within an overall piston and roll (a+b*x, where; a and b are constant). See FIGS. 2 and 5.

Figure 6:
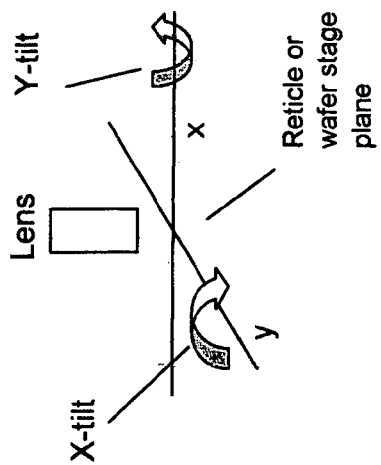
FIG. 6 shows scanner tilt definitions.
Figure 8:
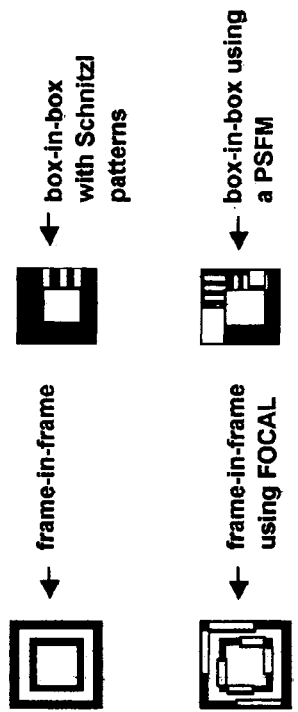
FIG. 8 shows typical focusing fiducials for; FOCAL, PSFM, and Schnitzl methods.
Figure 7:
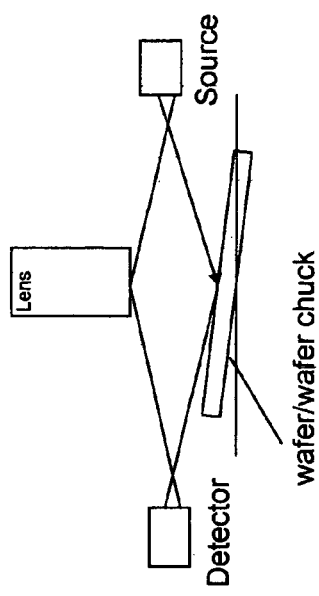
FIG. 7 generic wafer/stage leveling system with detector and source.
Figure 9:
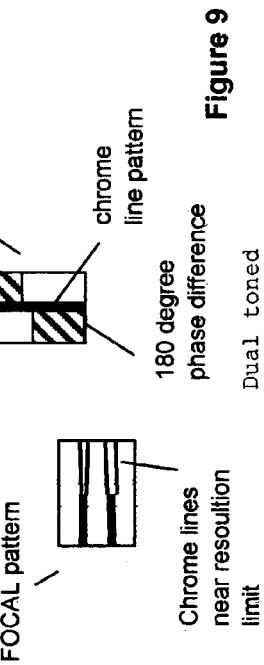
FIG. 9 shows typical focusing fiducials (FF) for FOCAL, PSFM, and Schnitzl.
Figure 9:
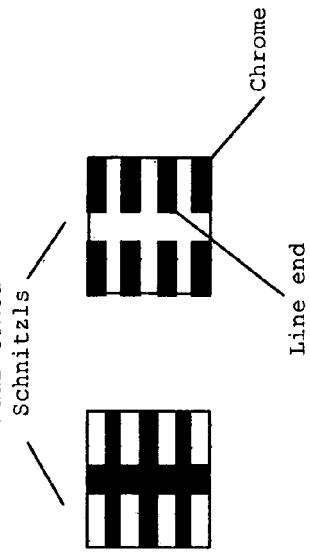
Figure 10:
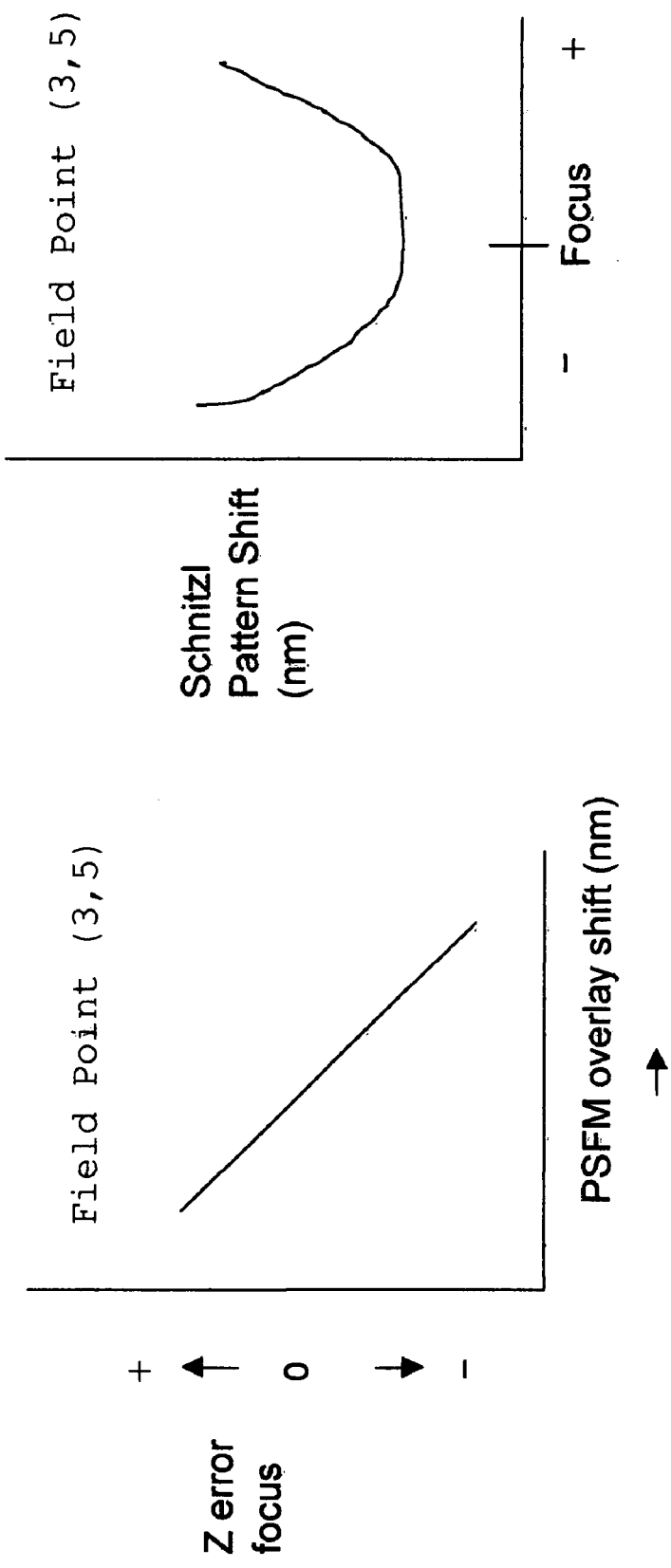
FIG. 10 shows a PSFM and Schnitzl calibration plot for one field point.

ZS(y)=dynamic scan piston. As discussed in "Dynamic Lens Field Curvature" supra, this is the moving average of a combination of instantaneous piston and pitch. See FIG. 5.

θ(y)=dynamic scan roll. This is a moving average of instantaneous scanner roll. See FIGS. 5 and 6.

Figure 3:
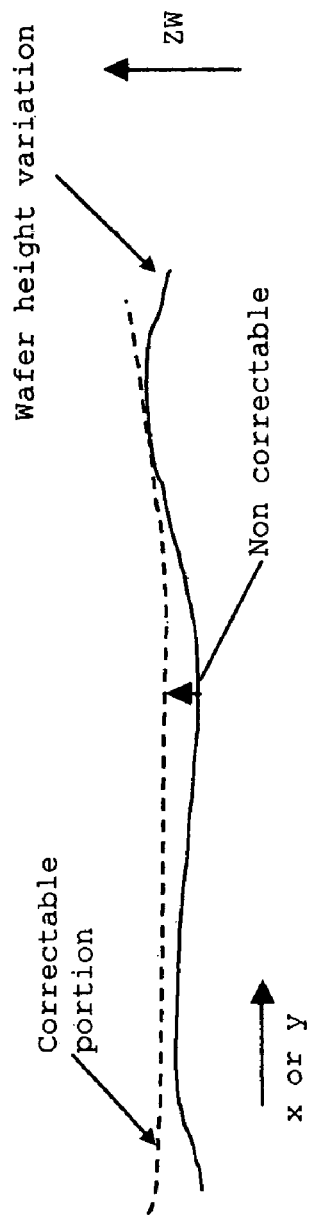
FIG. 3 shows wafer flatness correctables and high order terms.

ZW(x, y)=wafer height variation over the scan field. See FIGS. 3 and 5.

In addition; as described below, we define ZS(y) and θ(y) as the scanner dynamic focal plane deviation (SFPD). This is simply the scanner field curvature error associated with stage synchronization error in the Z direction. It should be noted that, even if there is a perfect lens with no dynamic lens field curvature (ZL=0), there can still be focal plane deviation due to SFPD (ZS and θ≠0).

Thus, a process for the determination of dynamic scanning field curvature uniquely associated with a photolithographic scanner is provided. A series of lithographic exposures is performed on a resist coated silicon wafer using a photolithographic scanner. The lithographic exposures produce an array of focusing fiducials that are displaced relative to each other in a unique way. The focusing fiducials are measured using an optical metrology tool. The resulting measurements are fed into a computer algorithm that calculates the dynamic scanning field curvature or dynamic scan focal plane deviation (SFPD) in an absolute sense in the presence of wafer height variation and other wafer/reticle stage irregularities.

Several different embodiments of systems constructed in accordance with the invention will be described. For purposes of discussion, each of these will be referred to as "main embodiments", although it should be noted that the embodiments comprise alternative constructions of systems that implement the teachings described herein.

Discussion of First Main Embodiment

In accordance with the invention, Focusing Fiducials (FF) are exposed onto a wafer in such a manner that the effects of wafer height variations can be isolated and eliminated, and a true measure of dynamic scan FPD (SFPD) can be obtained.

Figure 11:
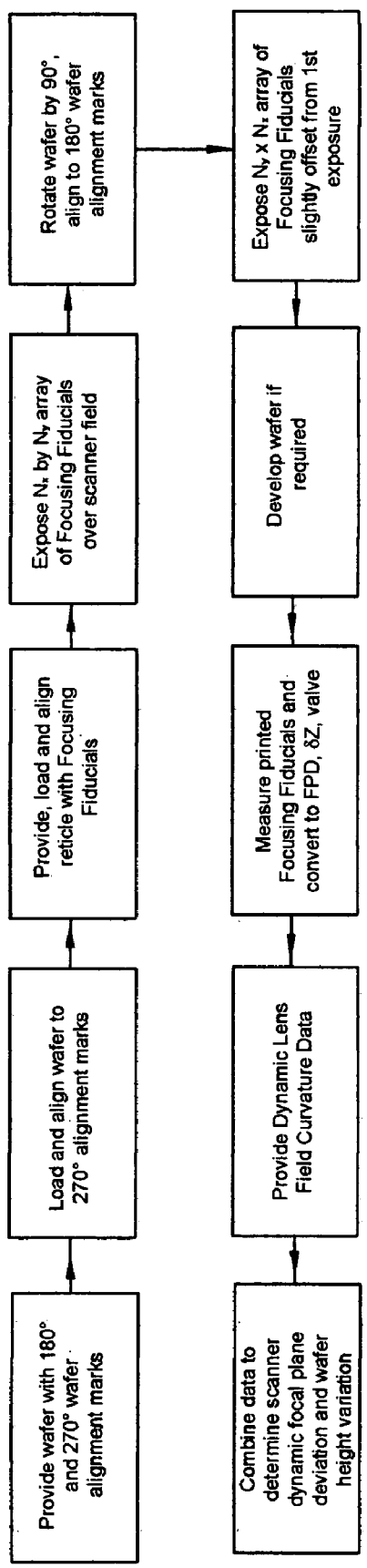
FIG. 11 shows the process flow for the first Main Embodiment.
Figure 12:
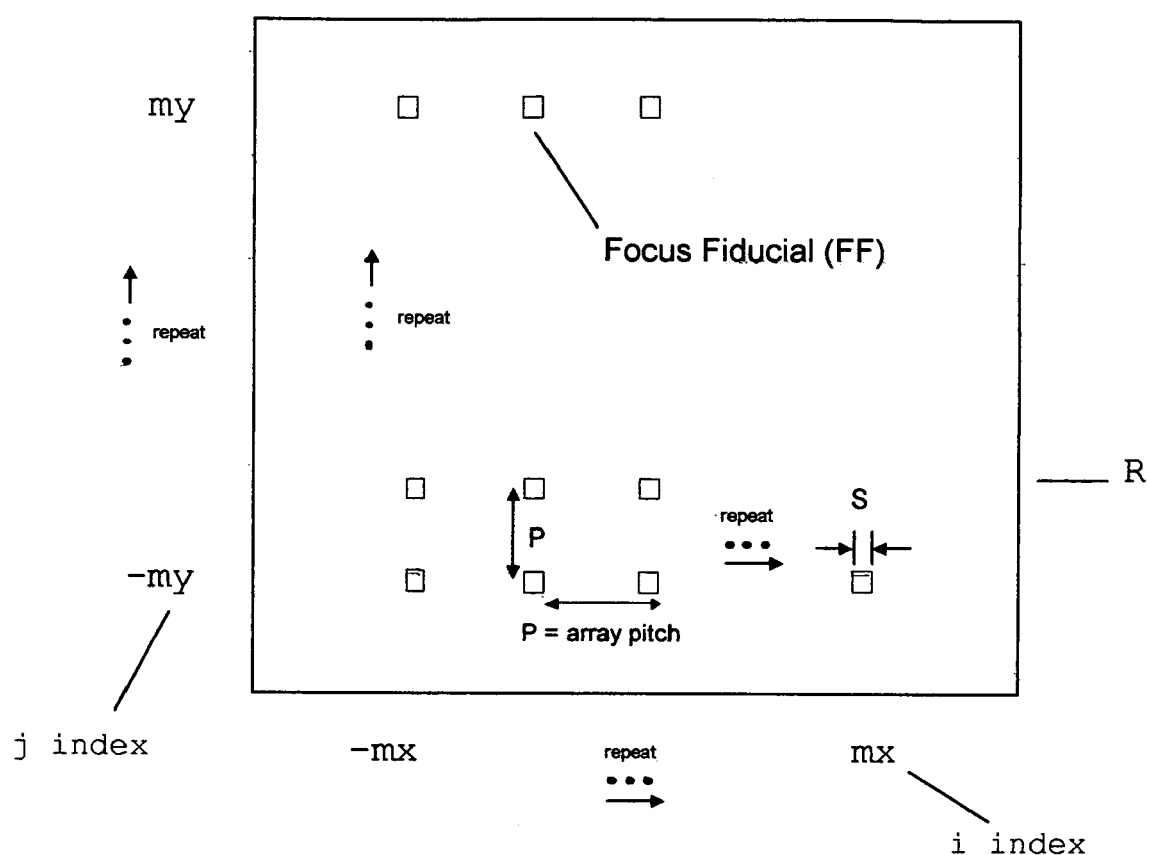
FIG. 12 shows a reticle with multiple focusing fiducials.

A process flow diagram for the first Main Embodiment is shown in FIG. 11. A schematic of a reticle containing a (2 mx+1*2my+1) array of focusing fiducials is shown in FIG. 12. Details for the first Main Embodiment will be explained for a square exposure field (mx=my) although it is appreciated that the case of rectangular fields is a direct generalization from that description.

1. Provide Wafer

Figure 13:
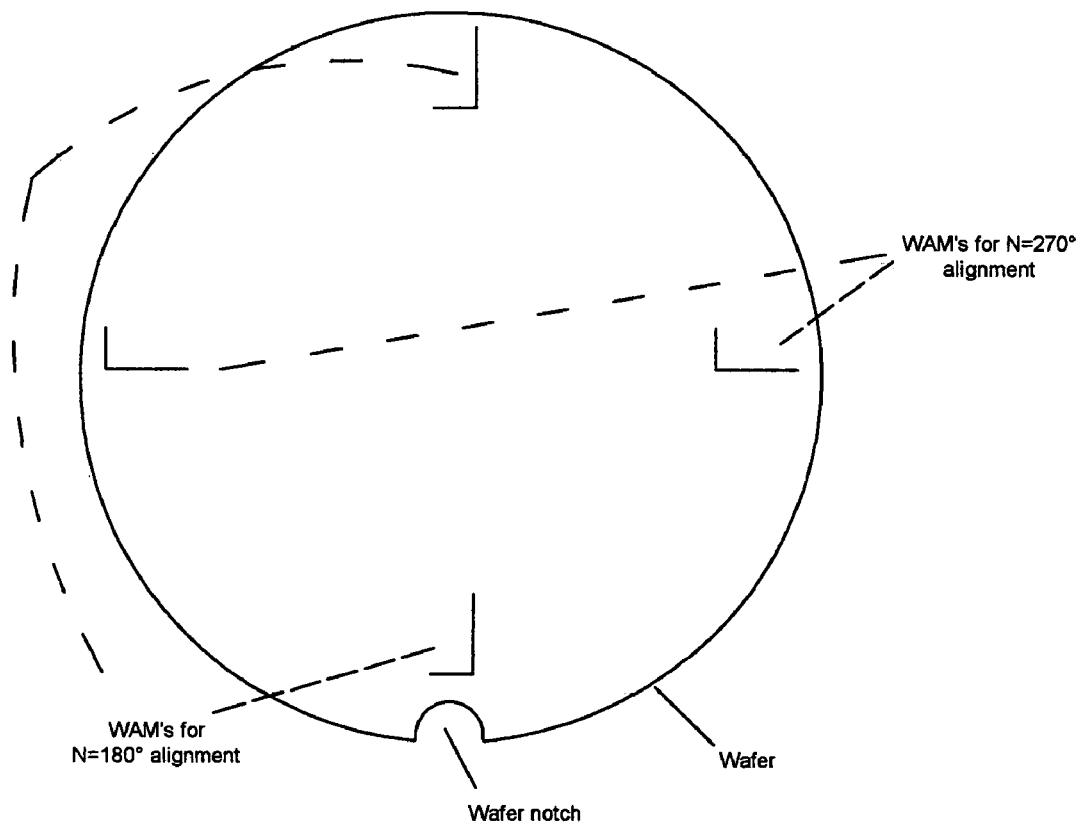
FIG. 13 shows wafer with wafer alignment marks (180° and 270°).

A resist coated wafer with wafer alignment marks disposed at 180° and 270° is provided (FIG. 13). The purpose of marks is to allow wafer to be inserted and aligned at two distinct notch angles that differ by +90° or −90° from one another. Depending on the scanner and FPD technology applied, the wafer notch itself could provide sufficient accuracy for the subsequent wafer alignments.

2. Load and Align Wafer

A wafer is then loaded at a notch angle N(N=0°, 90°, 180° or 270°) and is aligned to the corresponding wafer alignment marks.

3. Provide, Load and Align Reticle

Figure 15:
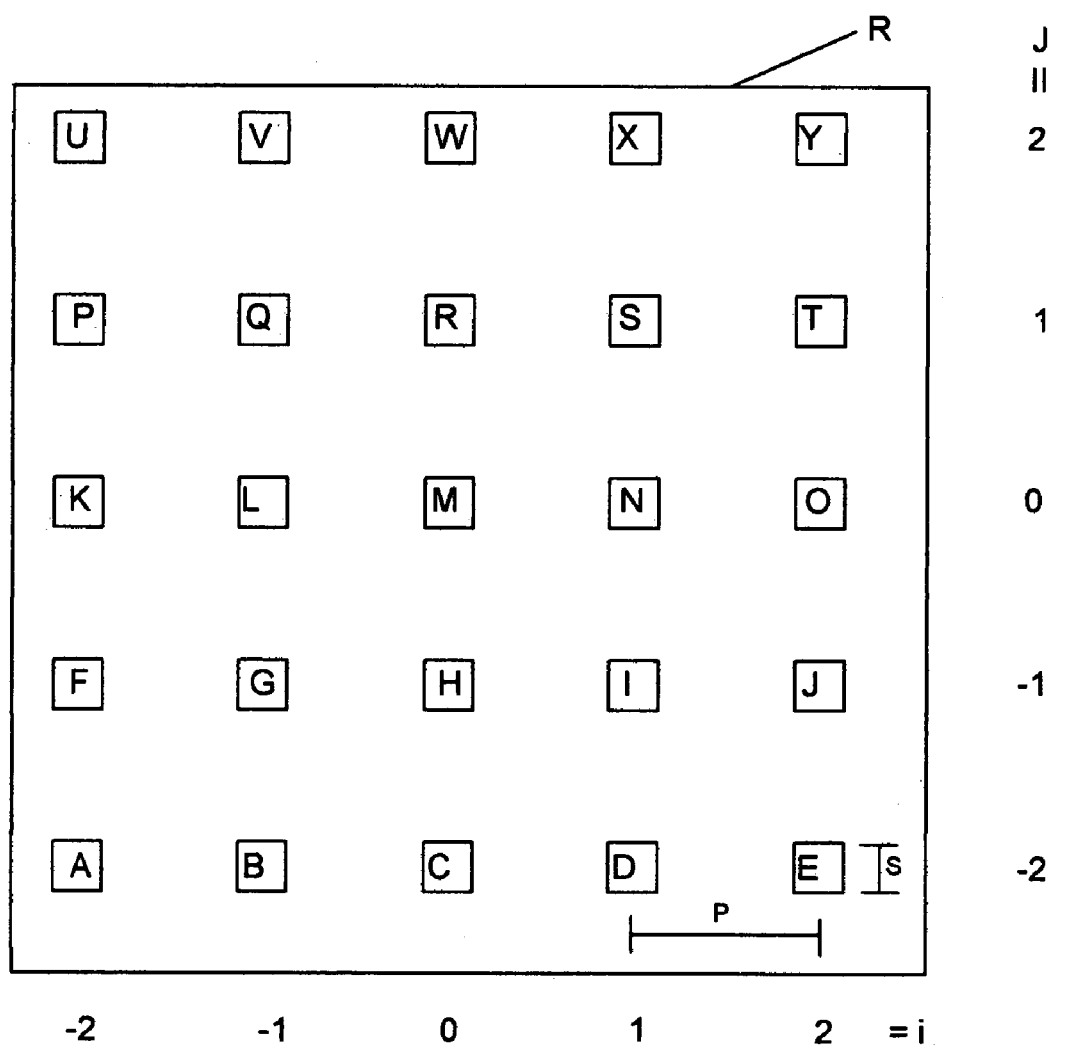
FIG. 15 shows schematic of focusing fiducial reticle used to carryout exposures shown in FIGS. 14a and 14b.

A focusing fiducial reticle is provided. The exact form taken depends on the technology employed, but they are all schematically represented in FIG. 12 as a (2 mx+1)* (2my+1) array of focusing fiducials (FF) on a pitch or spacing equal to P. The size or extent of each individual FF is S. The reticle is loaded and aligned on the scanner. FIG. 15 is a schematic of an exemplary focusing fiducial reticle that can be used in this embodiment.

4. First Exposure

Figure 14A:
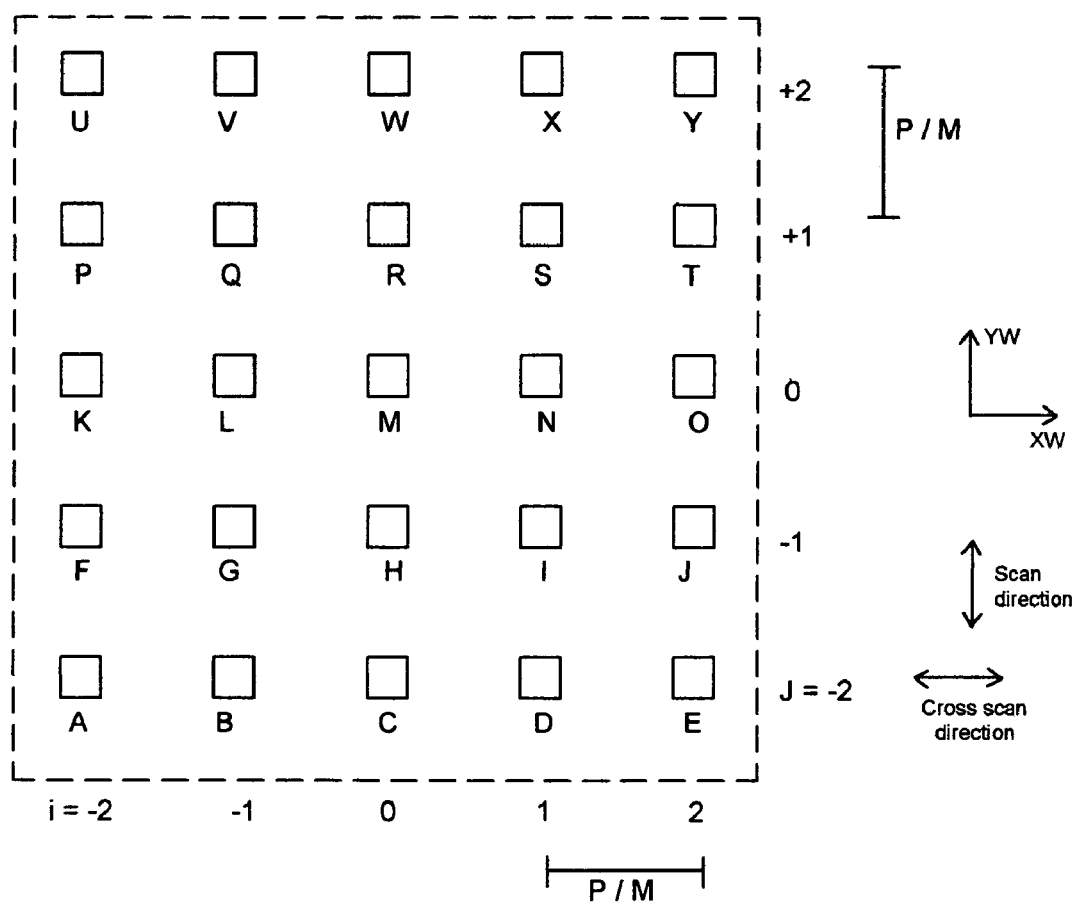
FIG. 14a shows the exposure pattern after the first exposure of the first Main Embodiment.

A reticle (R) containing an array of focusing fiducials (FF) at 2mx+1*2my+1 sites (FIG. 12) is exposed onto the wafer—forming exposure field, A (FIG. 14a, with mx=2, my=2 for example), where the projection of the individual focusing fiducial field points are labeled by the unprimed letters A:Y. In the following, we discuss the case where Nx and Ny are odd numbers, Nx=2mx+1, Ny=2my+1. The foregoing can be readily generalized to mixed odd-even, even-odd and even-even (NX−NY) configurations. This exposure is done with the field centered at position (XW1, YW1) on the wafer. A schematic of the exposed field is shown in FIG. 14a. Focusing Fiducials, FF, are indicated by the square boxes and labeled A:Y. Indices i and j indicating position within the scanned field of $$[XF(i), YF(j)] = \left(i*\frac{P}{M}, j*\frac{P}{M}\right)$$

are also shown. (XF, YF) are the coordinates (x, y) shown in FIG. 4.

5. Rotate Wafer and Align

The wafer is next rotated to a desired angle, for example the wafer can be rotated to notch angle 90° different from the original notch angle N (i.e. N±90°). It is aligned to the corresponding wafer alignment marks.

6. Second Exposure

Figure 14B:
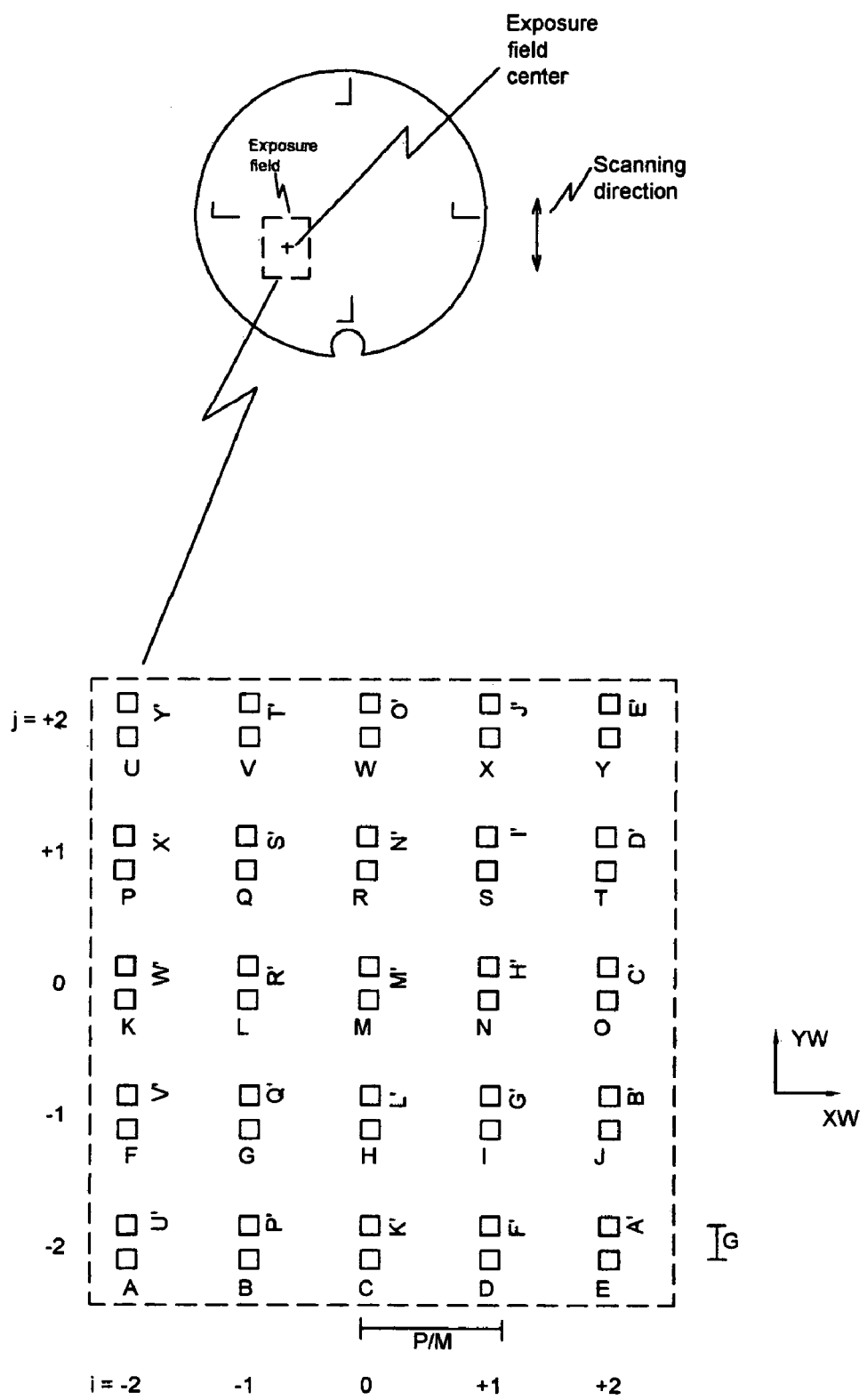
FIG. 14b shows a schematic of the exposed field after the $2^{nd}$ exposure of the first Main Embodiment.

The wafer is now exposed with field center shifted a distance G from the first exposure. FIG. 14b shows the field after the second exposure. Focusing Fiducials A':Y' were put down by this second exposure. The offset G is chosen so the focusing fiducials remain distinct and useable but the wafer flatness does not vary significantly over an interval of the size G. Since G is typically <1 mm at the wafer, only the higher frequency spatial variations contribute. Since the power spectral density of wafer flatness falls off rapidly at higher spatial frequencies, the variation over sizes <1 mm will typically be small (≦10 nm). In FIG. 14b, the wafer was rotated −90° from the original notch angle position for that exposure.

7. Develop Wafer

The wafer is now (optionally) developed. In the case of technologies that utilize the latent image, this step may be omitted. See, for example, "FOCAL: Latent Image Metrology for Production Wafer Steppers", supra. Also, after development, the wafer may be etched and the photoresist stripped to improve the quality of the focusing fiducials.

8. Measure Focus Fiducials

At this point, the focusing fiducials are measured and the data converted to an FPD value $\delta Z$. For example, if each FF was a box-in-box array exposed using a large pinhole aperture plate as described in U.S. Pat. No. 5,828,455, supra, and U.S. Pat. No. 5,978,085, supra, then after measuring each box-in-box array, we could determine the Zernike coefficient a4 and thereby infer the FPD:

$$\delta Z = \frac{dz}{da4} a4 \qquad \text{(Equation 2)}$$

See, for example, "Gauging the Performance of an In-Situ Interferometer", M. Terry et al. Denote the notch angle N focusing fiducial FPD values as:

$$\delta Z_{ij} \qquad \text{(Equation 3)}$$

where i=−mx:mx and j=−my:my. In FIG. 14b, these are the FPD values corresponding to FF's A:Y. Likewise, the FPD values corresponding to the FF's of the second exposure are:

$$\delta Z90_{ij} \qquad \text{(Equation 4)}$$

where i, j run over the same indices. In FIG. 14b, these are the FPD values corresponding to FF's A':Y'. Now, we can decompose $\delta Z(x,y)$ into contributions from the lens, the scan and the wafer as in Equation 1.

$$\delta Z(x,y) = ZL(x) + ZS(y) + x^*\theta(y) + ZW(x,y) \qquad \text{(Equation 5)}$$

This decomposition will be utilized below.

9. Provide Dynamic Field Curvature

Now while the dynamic lens field curvature, ZL(x), contributes to the FPD measurement, $\delta Z$, it must be excluded from assessment of the scanner height sensor/actuator subsystem. To take an extreme case, a flat wafer (ZW=0) and perfect scan hardware (ZS=q=0) would still exhibit a non-zero FF measurement $\delta Z$, since:

$$\delta Z(x,y) = ZL(x) \qquad \text{(Equation 6)}$$

Figure 2:
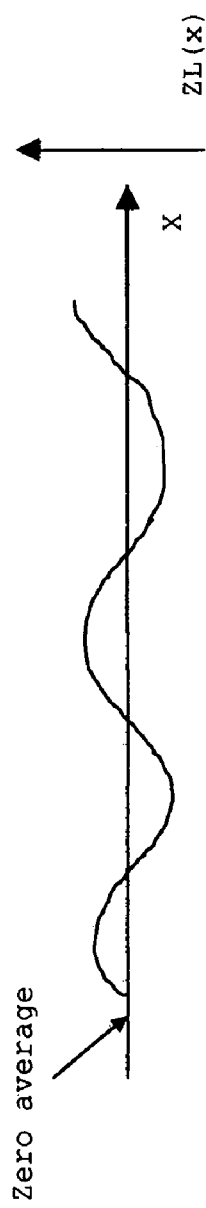
FIG. 2 shows typical dynamic lens field curvature plot with zero moment.
Figure 4:
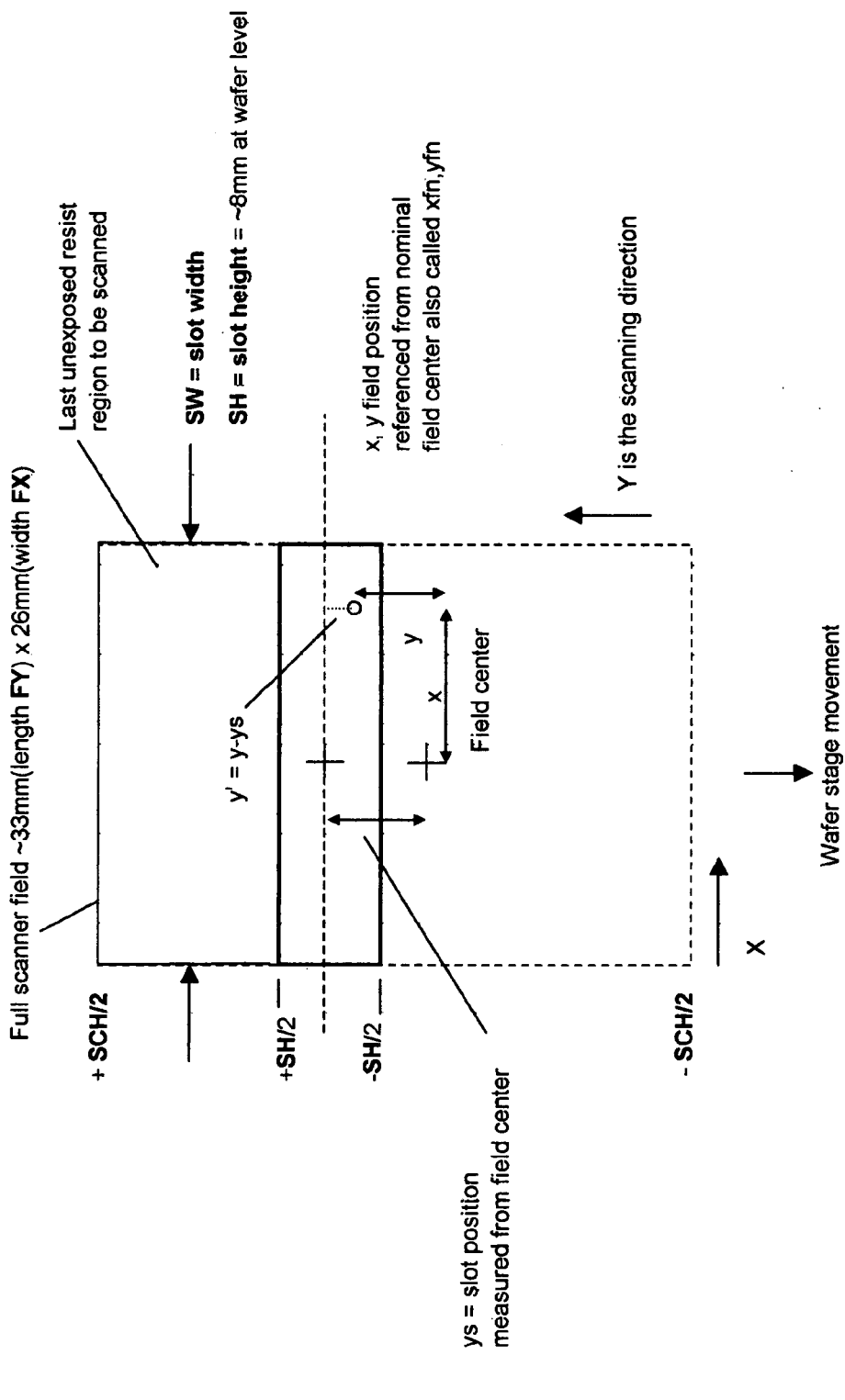
FIG. 4 shows the scanner exposure field coordinate system.

Since ZL(x) is independent of scanner dynamics, it can be determined once and subsequently subtracted from many $\delta Z(x,y)$ data sets on a single scanner. For example, ZL(x) can be determined using a technique as described in co-pending application entitled "APPARATUS AND PROCESS FOR DETERMINATION OF DYNAMIC LENS FIELD CURVATURE" by Smith et. al, application Ser. No. 10/833,557, assigned to the assignee of the present application. Also, as mentioned above, ZL(x) will typically not be determined to within a function a+b*x, where a and b, like ZL(x), will be independent of scan dynamics. In this case, the ZL(x) used in Equation 5 will have average and first moment=0 (FIG. 2).

$$\int_{-\frac{sw}{2}}^{\frac{sw}{2}} \frac{dx}{SW} ZL(x) = 0 \text{ and} \qquad \text{(Equation 7)}$$

$$\int_{-\frac{sw}{2}}^{\frac{sw}{2}} \frac{dx}{SW} \times ZL(x) = 0 \qquad \text{(Equation 8)}$$

where; SW is the slot width or width of the optical projection field perpendicular to the scan direction (FIG. 4). So, we are provided with the scanner dynamic field curvature ZL(x). The preferred method for determining the provided ZL(x) is described in the "APPARATUS AND PROCESS FOR DETERMINATION OF DYNAMIC LENS FIELD CURVATURE" patent application, supra.

10. Determine Dynamic Focal Plane Deviation

At this point, we combine the measured FPD values $\delta Z_{ij}$, $\delta Z90_{ij}$ and the provided dynamic lens field curvature $\delta ZL_i$ to determine the scanning focal plane deviation, SFPD, ($ZS_j$, $\theta_j$) and wafer height deviation $ZW_{ij}$.

Referring to FIG. 14b, and using the discrete indices i and j, we express $\delta Z_{ij}$ and $\delta Z90_{ij}$ as:

$$\delta Z_{ij} = ZL_i + ZW_{ij} + ZS_j + i*\frac{P}{M}\theta_j \qquad \text{(Equation 9)}$$

$$\delta Z90_{ij} = ZL_j + ZW_{ij} + ZS90_i + j*\frac{P}{M}\theta 90_i \qquad \text{(Equation 10)}$$

where:

$ZS90_i$, $\theta 90_i$=analogs of $ZS_j$, $\theta_j$ for the scan done at 90° rotation.

P=pitch of FF's on reticle

M=projection tool reduction magnification (=4 typically) and the other symbols are as previously defined.

Because ZL is known, it can subtract it from both sides of Equations 9 and 10 and defining $M_{ij}$ and $M90_{ij}$, $$M_{ij} = \delta Z_{ij} - ZL_i = ZW_{ij} + ZS_j + i*\frac{P}{M}\theta_j \qquad \text{(Equation 11)}$$

$$M90_{ij} = \delta Z90_{ij} - ZL_j = ZW_{ij} + ZS90_j + j*\frac{P}{M}\theta 90i \qquad \text{(Equation 12)}$$

Both $M_{ij}$ and $M90_{ij}$ are known from our knowledge of $\delta Z_{ij}$, $\delta Z90_{ij}$ and $ZL_i$. Equations 11 and 12 can now be solved for $ZW_{ij}$, $ZS_j$, $\theta_j$, $ZS90_i$, and $\theta 90_i$ via the singular valve decomposition but not without ambiguity. As discussed further below, these ambiguities can be resolved. See "Numerical Recipes, The Art of Scientific Computing", W. Press et al., *Cambridge University Press*, pp. 52–64, 1990; and "Numerical Recipes, The Art of Scientific Computing", W. Press et al., *Cambridge University Press*, pp. 509–520, 1990. It can be shown that Equations 11 and 12 imply:

$$ZW_{ij} = ZW'_{ij} + c'' + d''*j + e''*i + f''*i*j \qquad \text{(Equation 13)}$$

$$ZS_j = ZS'_j + c + d*j \qquad \text{(Equation 14)}$$

$$\frac{P}{M}\cdot\theta_j = \frac{P}{M}\theta'_j + e + f*j \qquad \text{(Equation 15)}$$

-continued $$ZS90_i = ZS90'_i + c + e*i \quad \text{(Equation 16)}$$

$$\frac{P}{M}\theta90_i = \frac{P}{M}\theta90'_i + d + f*i \quad \text{(Equation 17)}$$

where the single primed quantities ($ZW'_{ij}$, $ZS'_j$, $\theta'_j$, ...) are uniquely determined but the constants c, c", d, d", e, e", f, f" are only partially determined. The relations amongst the remaining unknown quantities are:

$$c1 = c + c'' \quad \text{(Equation 18)}$$

$$d1 = d + d'' \quad \text{(Equation 19)}$$

$$e1 = e + e'' \quad \text{(Equation 20)}$$

$$f1 = f + f'' \quad \text{(Equation 21)}$$

where c1, d1, e1, f1 are determined from the $M_{ij}$, $M90_{ij}$ and the single primed quantities ($ZW'_{ij}$, ...). We now discuss the resolution of these ambiguities.

c+c"

From Equation 14, c represents the average piston or average offset of the SFPD while c" (Equation 13) is the average wafer height over the scanning field. While we know their combination (Equation 18), Equations 11 and 12 do not specify their apportionment. However, since average wafer height over the scan field should be corrected or compensated for by the scanner height sensors and actuators, we can assign all of this deviation to the scanner.

By this interpretation we then have:

$$c'' = 0 \quad \text{(Equation 22)}$$

$$c = c1 \quad \text{(Equation 23)}$$

d+d"

From Equation 14, d represents the average slope of the dynamic scan piston $ZS_j$ while d" in Equation 13 is the average wafer slope in the scan direction. Again, we know the value of their sum, d1 of Equation 19, but Equations 11 and 12 provide no more information.

In this case, average wafer slope, d", should be completely correctible by the scanning height sensors and actuators. The combination d+d" represent the error in correcting for average wafer height. Therefore by this interpretation we have:

$$d'' = 0 \quad \text{(Equation 24)}$$

$$d = d1 \quad \text{(Equation 25)}$$

e+e"

This combination consists of wafer tilt in the y-direction (e" in Equation 13) and dynamic scan piston ($Z90_t$, Equation 16) slope. Its resolution is similar to the d+d" case. Their results:

$$e'' = 0 \quad \text{(Equation 26)}$$

$$e = e1 \quad \text{(Equation 27)}$$

f+f"

f" in Equation 13 is 45° rotated, saddle shaped wafer height variation over exposure field. Because of its long range character, this mode should be well detected with high fidelity by the scanner look ahead sensors.

$f*i*j = i*(f*j) = $ linearly varying roll ($\theta_j$) over the wafer field (linearly varying pitch across the field is not possible physically). This scanner mode can be reconstructed by linearly increasing the instantaneous roll (as opposed to the slot height averaged roll, $\theta_j$) linearly in time at constant scan speed.

The combination, $(f+f')*i*j$ represents the total error of the scanner system in correcting for 45° saddle wafer height deviations. So while the relative contributions of the wafer and scanner are not determined, we do know the scanner error or bias in this mode. Since it is a 100% correctable mode, we can justifiably attribute all of it to the performance of the scanner height sensors and adjusters.

So:

$$f'' = 0 \quad \text{(Equation 28)}$$

$$f = f1 \quad \text{(Equation 29)}$$

Algorithm

At this point, we have uniquely determined the SFPD for both scans (($ZS_j$, $\theta_j$), ($ZS90_j$, $\theta90_j$)).

The method for doing so consisted of subtracting out the provided lens dynamic field curvature from the measured FPD values and solving the resulting equations (11 and 12) using the minimum norm solution provided by the singular value decomposition. See, for example, "Numerical Recipes, The Art of Scientific Computing", pp. 52–64, supra, "Numerical Recipes, The Art of Scientific Computing", pp. 509–520, supra. Calling $ZW^*_{ij}$ the numerical solution for $ZW_{ij}$ from this process we calculate the constants c", d", e", f" which minimize:

$$E = \sum_{i,j}[ZW^*_{ij} - (c'' + d''*j + e''*i + f''*i*j)]^2 \quad \text{(Equation 30)}$$

Figure 17:
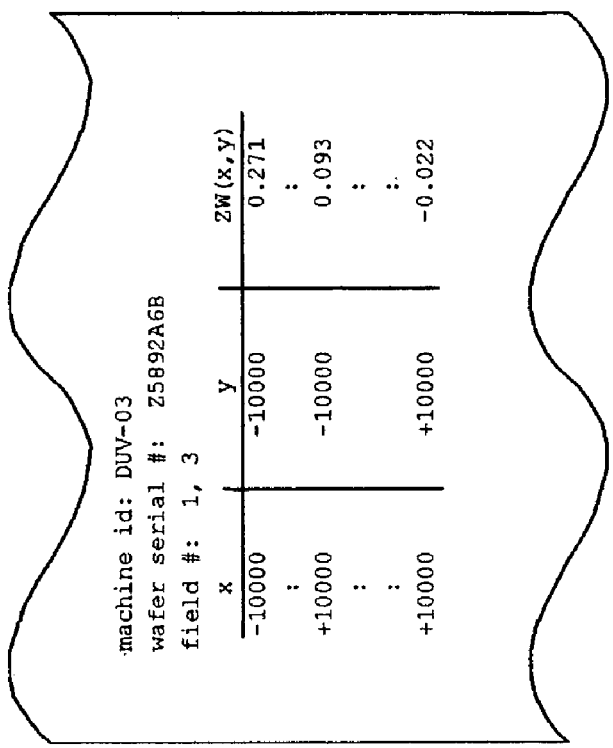
FIGS. 16 and 17 show output for the system of FIG. 1, providing scanning field curvature and wafer height error data map.
Figure 16:
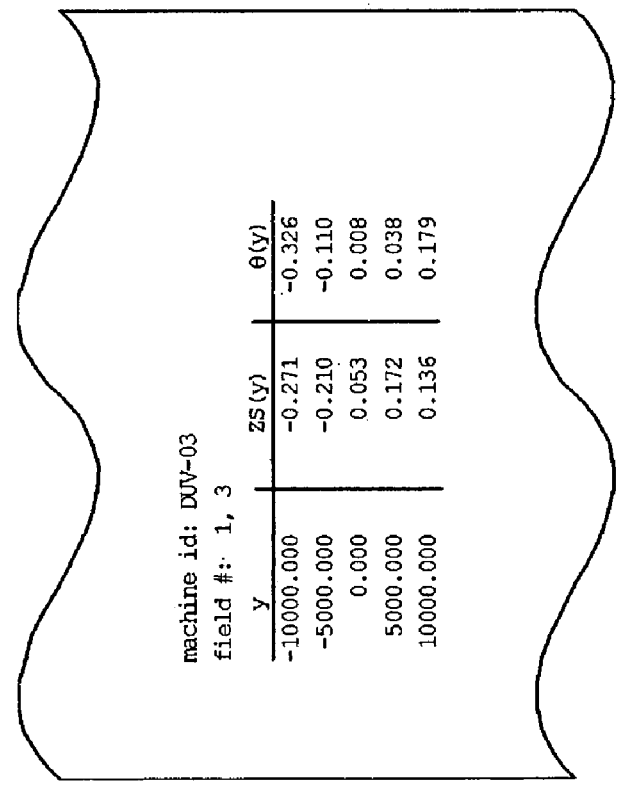

This is easily done by least squares techniques well-known to those skilled in the art. Then we compute $ZW_{ij}$, $ZS_j$, $\theta_j$, $Z90_i$, $\theta90_i$ as:

$$ZW_{ij} = ZW^*_{ij} - (c'' + d''*j + e''*i + f''*i*j) \quad \text{(Equation 31)}$$

$$ZS_j = ZS^*_j + c'' + d''*j \quad \text{(Equation 32)}$$

$$\frac{P}{M}\theta_j = \frac{P}{M}\theta^*_j + e'' + f''*i \quad \text{(Equation 33)}$$

$$ZS90_i = ZS90^* = c'' + e''*i \quad \text{(Equation 34)}$$

$$\frac{P}{M}\theta90_i = \frac{P}{M}\theta90^*_i + d'' + f''*i \quad \text{(Equation 35)}$$

Where the starred (*) quantities are the minimum norm SVD solutions, and $ZW_{ij}$, ($ZS_j$, $\theta_j$), ($ZS90_i$, $\theta90_i$) represents our final determination of wafer flatness and SFPD. FIGS. 16 and 17 show examples of the final results of the method described above.

Discussion of Second Main Embodiment

Figure 18:
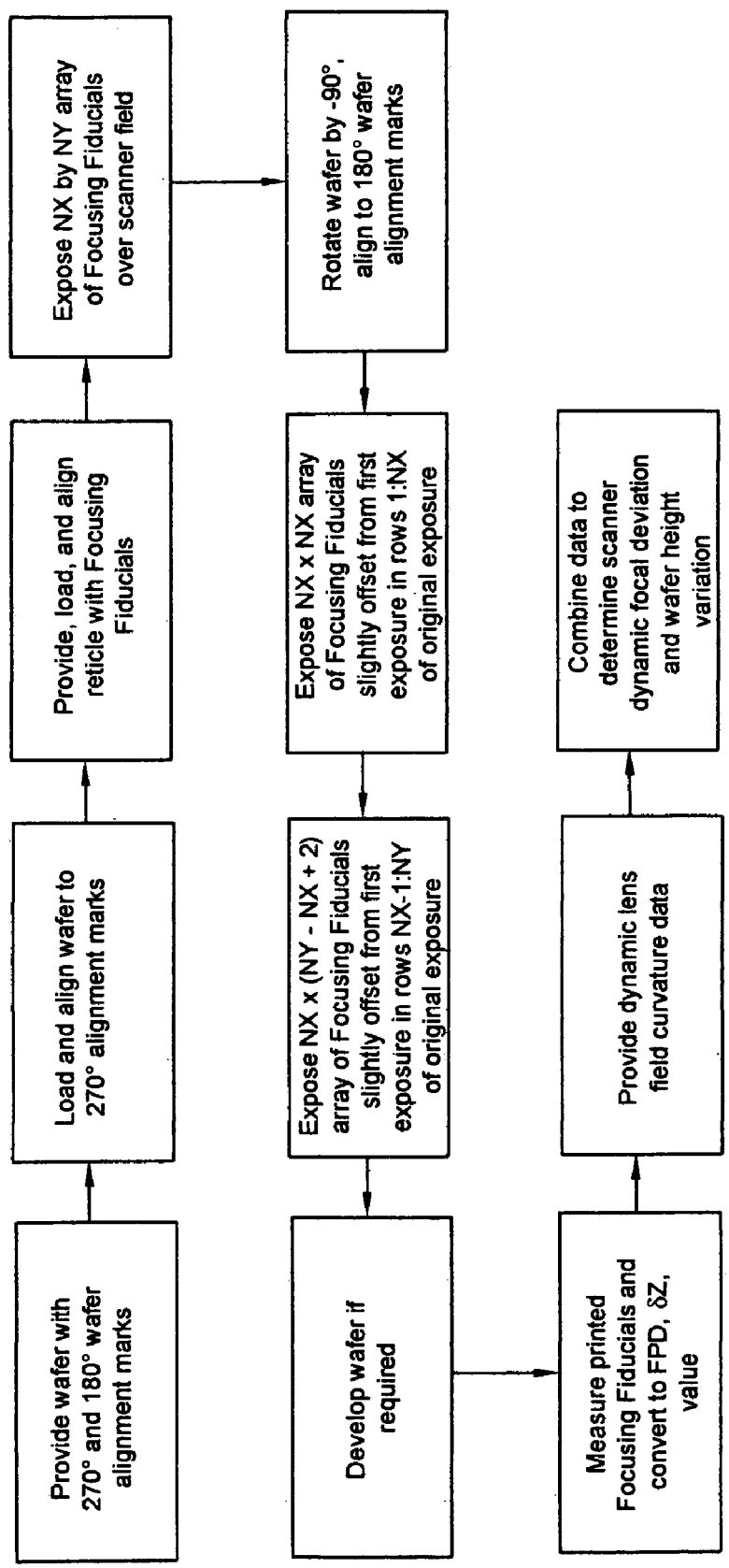
FIG. 18 shows the steps for carrying out the second Main Embodiment.

In the first Main Embodiment we have discussed in detail the practice of this invention to cases where the size of the scanned field (FX, FY) (FIG. 4) is smaller than or equal to the lesser of the slot width SW and maximum scan length SL. The present embodiment is practiced when FY (the interrogated field size in the Y direction) is greater than the maximum slot width, SW of FIG. 4. In terms of the focusing fiducials on the focusing fiducial reticle of FIG. 12, if we call the maximum number of FF's across the projected field in the X or cross scan direction $NX_{max}$ and the required number of FF's in the Y or scan direction NY, when $$NX_{max} < NY < 2NX_{max} - 1 \quad \text{(Equation 36)}$$

we can apply the present embodiment. Equation 36 typically holds for scanner fields. FIG. 18 outlines the steps for carrying out the present embodiment.

Provide Wafer, Load and Align Wafer

The first two operations for the second Main Embodiment (listed as "provide wafer" and "load and align wafer") are the same as the corresponding operations in the first Main Embodiment described above. The first and second Main Embodiment differs in the subsequent operations:

Provide, Load, and Align Reticle

Figure 19:
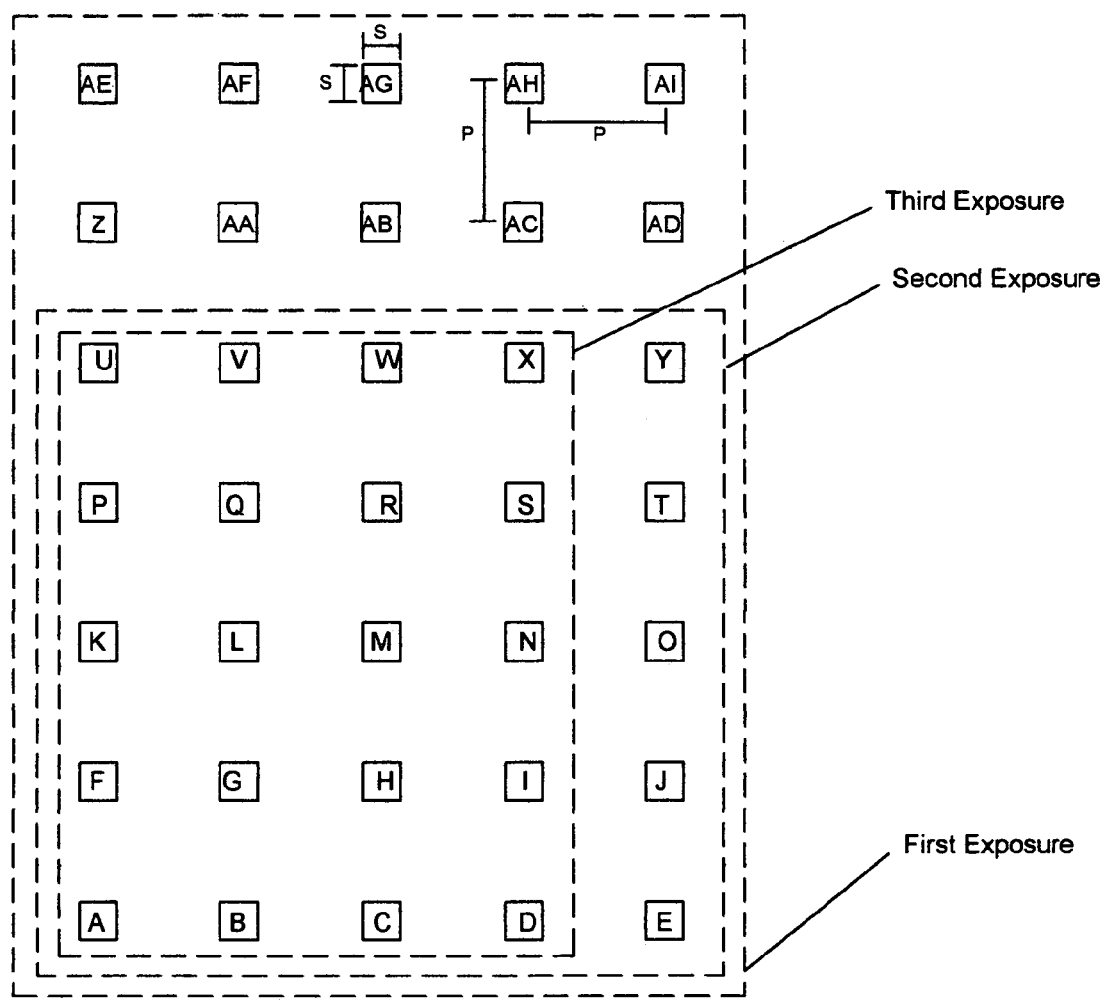
FIG. 19 shows in schematic the sections of the FF reticle used for the second Main Embodiment as illustrated in FIGS. 20, 21 and 22.

FF reticle as above is provided, loaded, and aligned. FIG. 19 shows the sections of this FF reticle used to carry out the exposures illustrated in FIGS. 20, 21, and 22. FF's are indicated by squares and have each been distinctly labeled with the letters A:AI.

First Exposure

An NX×NY array of focusing fiducials is exposed. As discussed above, $NX_{max} < NY$. FIG. 20 shows an NX=5× NY=7 first exposure with FF's represented by squares labeled A:AI. This exposure was made with wafer notch angle (N)=270°.

Rotate Wafer

Figure 23:
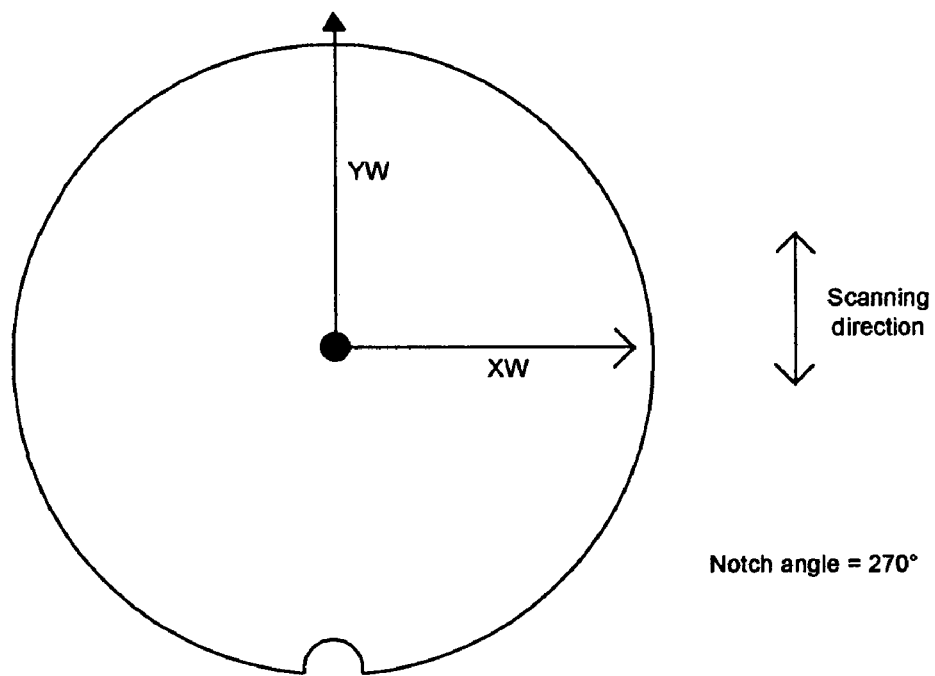
FIG. 23 shows the relation of the wafer coordinates, wafer notch angle and lithography tool scanning direction to one another.
Figure 23:
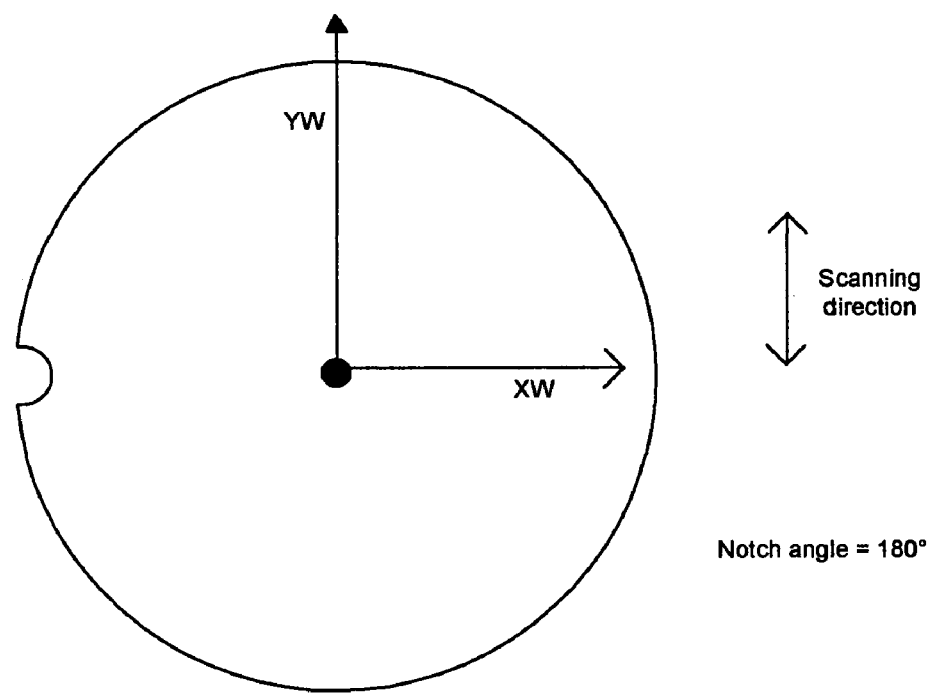

The wafer is now rotated a desired angle, for example the wafer may be rotated −90° so the orientation of the wafer relative to the scanning direction will be as shown in FIG. 23, 'Notch angle=180°'.

Second Exposure

Figure 21:
FIG. 21 shows a schematic of the exposed field after the $2^{nd}$ exposure for the second Main Embodiment.

An NX×NX exposure slightly offset a distance G from the first exposure is now done. It overlaps rows irow=1:NX and columns icol=1:NX of the first exposure. FIG. 21 shows the result at overlapping exposures. A':Y' are the FF's exposed during this step, the scan direction is indicated by the double pointed arrow. Note that rows irow=6:7 are not overlapped during this exposure.

Shift Wafer

The wafer is now shifted and slightly offset so that the non-overlapped rows irow=NX+1:NY (irow=6:7 of FIG. 21) are overlapped with the two rows of the original exposure irow=NX−1:NX (irow=4:5 of FIG. 20) following rotation of the wafer.

Third Exposure

Figure 22:
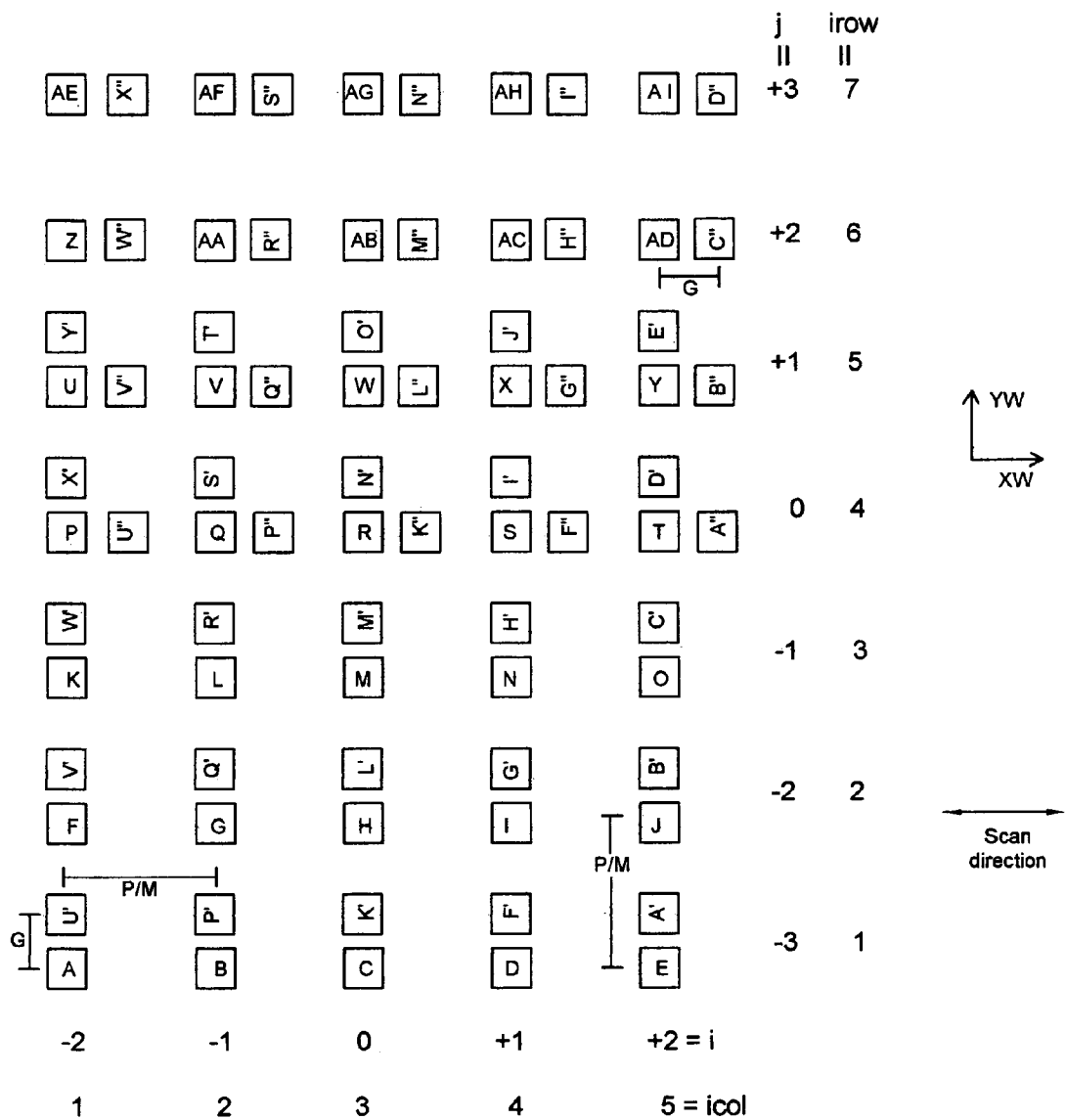
FIG. 22 shows a schematic of the exposed field after the $3^{rd}$ exposure for the $2^{nd}$ main embodiment.

The wafer is now exposed so the non-overlapped rows irow=NX+1:NY (irow=6:7 of FIG. 21) are overlapped with the two rows of the original exposure irow=NX−1:NX (irow=4:5 of FIG. 20). In FIG. 22 corresponding sites on the FF reticle of FIG. 19 are indicated by the same letter e.g. A, A', and A" of FIG. 22 are FF's exposed using the FF labeled A in FIG. 19. The purpose of the two overlapped rows (irow=4:5) is to 'stitch together' in the Z direction the second and third scans. Separate scans must have two or more rows overlapped for this invention to be operable.

Develop Wafer

The wafer is now (optionally) developed. In the case of technologies (See, for example, "FOCAL; Latent Image Metrology for Production Wafer Steppers", supra) that utilize the latent image, this step may be omitted. Also, after development, the wafer may be etched and the photoresist stripped to improve the quality of the focusing fiducials.

Measure Focus Fiducials

The focusing fiducials are now measured and converted to FPD values. From the first exposure (FF's A: AI of FIG. 22) we set the FPD values $$\delta Z_{ij} \quad \text{(Equation 37)}$$

i=−mx:mx, j=−my:my where

NX=2mx+1 and NY=2my+1.

In the case of FIG. 22 we have mx=2, my=3.

From the second exposure (FF's A':Y' of FIG. 22) we get the FPD values $$\delta ZL90_{ij} \quad \text{(Equation 38)}$$

i=−mx:mx, j=−my:2mx−my

From the third exposure (the double primed (") FF's in FIG. 22) we get the FPD values $$\delta ZU90_{ij} \quad \text{(Equation 39)}$$

i=−mx:mx, j=2mx−my−1:my

In Equations 37, 38 and 39 we have indexed the FPD values by the i, j index corresponding to its physical column, row position within the exposure field.

Provide Dynamic Field Curvature

Now while the dynamic lens field curvature, ZL(x), contributes to the FPD measurement, δZ, it must be excluded from assessment of the scanner height sensor/actuator subsystem.

So, we are provided with the scanner dynamic field curvature ZL(x). "Dynamic Lens Field Curvature", supra describes the preferred method for determining ZL.

Determine Dynamic Focal Plane Deviation

At this point, we combine the measured FPD values $\delta Z_{ij}$, $\delta ZL90_{ij}$, $\delta ZU90_{ij}$ and the provided dynamic lens field curvature $ZL_i$ to determine the SFPD $(ZS_j, \theta_j)$ of the first scan and the wafer height deviation, $ZW_{ij}$, at the FF's.

We now express the measured FPD values as in Equations 9 and 10 by the following equation systems:

$$\left. \begin{array}{l} \delta Z_{ij} = ZL_i + ZW_{ij} + ZS_j + i * \dfrac{P}{M}\theta j \\ i = -mx:mx \quad j = -my:my \end{array} \right\} \quad \text{(Equation 40)}$$

$$\left. \begin{array}{l} \delta ZL90_{ij} = ZL_{j+KLI} + ZW_{ij} + ZSL90_i + (j + KL)\dfrac{P}{M}\theta L90_i \\ i = -mx:mx \quad j = -my:2mx-my \quad KL = KLI = my - mx \end{array} \right\} \quad \text{(Equation 41)}$$

-continued $$\delta ZU90_{ij} = ZL_{j+KUI} + ZW_{ij} + ZSU90_i + (j+KU)\frac{P}{M}\theta U90_i \quad \text{(Equation 42)}$$
$$i = -mx:mx \quad j = 2mx - my - 1:my$$
$$KUI = -3mx + my + 1 \quad KU = \frac{1}{2} - mx$$

where:
- $(ZS_j, \theta_j)$=(integrated scanner piston/pitch, integrated scanner roll) for the first exposure
- $(ZSL90_i, \theta L90_i)$=similar for second exposure
- $(ZSU90_i, \theta U90_i)$=similar for third exposure
- P=pitch of FF's on reticle
- M=projection tool reduction magnification ratio and the other symbols are as previously defined.

As before, we subtract the provided ZL from both sides of Equations 40, 41 and 42 to get:

$$M_{ij} = \delta Z_{ij} - ZL_i = ZW_{ij} + zs_j + i*\frac{P}{M}\theta_j \quad \text{(Equation 43)}$$
$$i = -mx:my \quad j = -my:my$$

$$ML90_{ij} = \delta ZL90_{ij} - ZL_{j+KLI} = ZW_{ij} + ZSL90_i + (j+KL)\frac{P}{M}\theta L90_i \quad \text{(Equation 44)}$$
$$i = -mx:mx \quad j = -my:2mx - my \quad KL = KLI = my - mx$$

$$MU90_{ij} = \delta ZU90_{ij} - ZL_{j+KUI} = ZW_{ij} + ZSU90_i + (j+KU)\frac{P}{M}\theta U90_i \quad \text{(Equation 45)}$$
$$i = -mx:mx \quad j = 2mx - my - 1:my \quad KUI = -3mx + my + 1$$
$$KU = \frac{1}{2} - mx$$

The equation system represented by Equations 43, 44 and 45 can now be solved for $ZW_{ij}$, $ZS_j$, $\theta_j$, $ZSL90_i$, $\theta L90_i$, $ZSU90_i$, and $\theta U90_i$ by the singular value decomposition. See, for example, "Numerical Recipes, The Art of Scientific Computing", pp. 52–64, supra; and "Numerical Recipes, The Art of Scientific Computing", pp. 509–520, supra. However, the solution is not unique as these are four singular or undetermined modes to the system of equations. An investigation into their structure reveals that they can all be associated with an ambiguity in the wafer heights $ZW_{ij}$ of the form $$ZW_{ij} = ZW'_{ij} + c'' + d''*j + e''*i + f''*i*j \quad \text{(Equation 46)}$$

i=−mx:mx, j=−my:my and an ambiguity in the first exposure SFPD that takes the form:

$$ZS_j = ZS'_j + c + d*j \quad \text{(Equation 47)}$$

$$\frac{P}{M}\theta_j = \frac{P}{M}\theta'_j + e + f*j \quad \text{(Equation 48)}$$

The second and third exposure SFPD's also exhibit an ambiguity that is a function of the parameters (c, c'', d, d'', e, e'', f, f'') but involves no new parameters. The discussion of the resolution of these ambiguities is now the same as in the first Main Embodiment and we can proceed with the algorithm for determining SFPD.

Algorithm

The technique for determining the SFPD for the first scan $(ZS_j, \theta_j)$ and the wafer heights at the FF locations consists of the following operations:

Subtract out the provided lens dynamic field curvature (ZL) from the measured FPD's ($\delta Z$) per Equations 43, 44 and 45;

Solve Equations 43, 44, and 45 using the minimum norm singular value decomposition to arrive at a numerical solutions for the wafer heights ($ZW^*_{ij}$), the first scan SFPD ($ZS^*_j, \theta^*_j$) and the second and third scan SFPD (see "Numerical Recipes, The Art of Scientific Computing", pp. 52–64, supra and "Numerical Recipes, The Art of Scientific Computing", pp. 509–520, supra);

Minimize the quantity $$E = \sum_{i,j}[ZW^*_{ij} - (c'' + d''*j + e''*i + f''*i*j)]^2 \quad \text{(Equation 49)}$$

over the quantities c'', d'', e'', f'' and thereby determine their values;

Compute the SFPD of the first scan as:

$$ZS_j = ZS^*_j + c'' + d''*j \quad \text{(Equation 50)}$$

$$\frac{P}{M}\theta_j = \frac{P}{M}\theta^*_j + e'' + f''*j \quad \text{(Equation 51)}$$

Compute the wafer height variation at the FF's as:

$$ZW_{ij} = ZW_{ij}^* - (c'' + d''*j + e''*i + f''*i*j) \quad \text{(Equation 52)}$$

FIGS. 16 and 17 show the final results of the method of this embodiment.

Variations of the Main Embodiments

We now outline a number of variations of the two main embodiments of this invention.

In the second Main Embodiment, we discussed and showed in detail the case of the minimum overlap (2 rows) required by the second and third exposures. Improved performance results by overlapping more than two rows, measuring the complete set of FF's, setting up the equations analogous to Equations 43, 44, and 45 and then carrying out the steps in the algorithm section.

An extension of the second Main Embodiment would consist of three additional exposures done at −90° to the first exposure, each additional exposure overlapping at least two rows of the adjacent exposures. Four equation sets instead of three sets (Equations 43, 44, and 45) are set up, solved and the ambiguity resolved as in the second Main Embodiment.

Four or more additional exposures at −90° from the first exposure is another variation on the second Main Embodiment.

Heretofore in our exposition of the two main embodiments, we have referred to single exposures of the scanner as creating the necessary FF's on the wafer. Some technologies such as PSFM will produce FF's in a single exposure. See, for example, U.S. Pat. No. 5,300,786, supra. Technologies such as the In-Situ Interferometer require two separate exposures to create a single focusing fiducial. One exposure creates the so-called 'MA' pattern that is the carrier of the wafer, lens and scanner height variation information, while the other exposure creates the so-called 'MO' pattern. See U.S. Pat. No. 5,828,455, supra; and U.S. Pat. No. 5,978,085, supra. The MO pattern creates a reference so the resulting FF can be read in an overlay metrology tool. Since the MO does not carry any significant wafer lens or scanner height variation information, this second exposure, for the purposes of this invention, can be lumped together with the first or MA exposure.

The process described above could be made more sophisticated and precise by taking into account reticle flatness effects. If we previously measure or otherwise know the reticle flatness and then provide it ($ZR_{ij}$) then referring the Equations 11 and 12, we would compute $M_{ij}$ and $M90_{ij}$ as:

$$M_{ij} = \delta Z_{ij} - ZL_i - ZR_{ij}/M^2 \quad \text{(Equation 53)}$$

$$M90_{ij} = \delta Z90_{ij} - ZL_j - ZR_{i,j-1}/M^2 \quad \text{(Equation 54)}$$

where $ZR_{ij}$=reticle flatness deviation at x location=i and y location=j (FIG. 12)

M=reduction magnification ratio (typically 4).

The subsequent steps of the first Main Embodiment then follow word for word. Technique applies to the second Main Embodiment and generalizations of same.

Therefore, in the case of ISI technology being used for creating FF's, we would call the MA/MO exposure pair an exposure group. Then, in applying the two main embodiments to an ISI FF, the called for 'exposures' would be replaced by 'exposure groups', each exposure group consisting of an MA/MO pair made in accordance with the practice of the ISI FF technology. See U.S. Pat. No. 5,828, 455, supra; and U.S. Pat. No. 5,978,085, supra.

In the case of other technologies that require multiple exposures to create a single FF that can produce an FPD value, we would practice the present invention by designating the multiple exposures as a single exposure group and follow the method of this invention by using exposure groups where exposures are called for in the two main embodiments or their extensions.

Heretofore we have specified this invention with the wafer notch angles being specifically 180° and 270°. In practice, any two wafer notch angles differing by +90° or −90° could be used.

Figure 24:
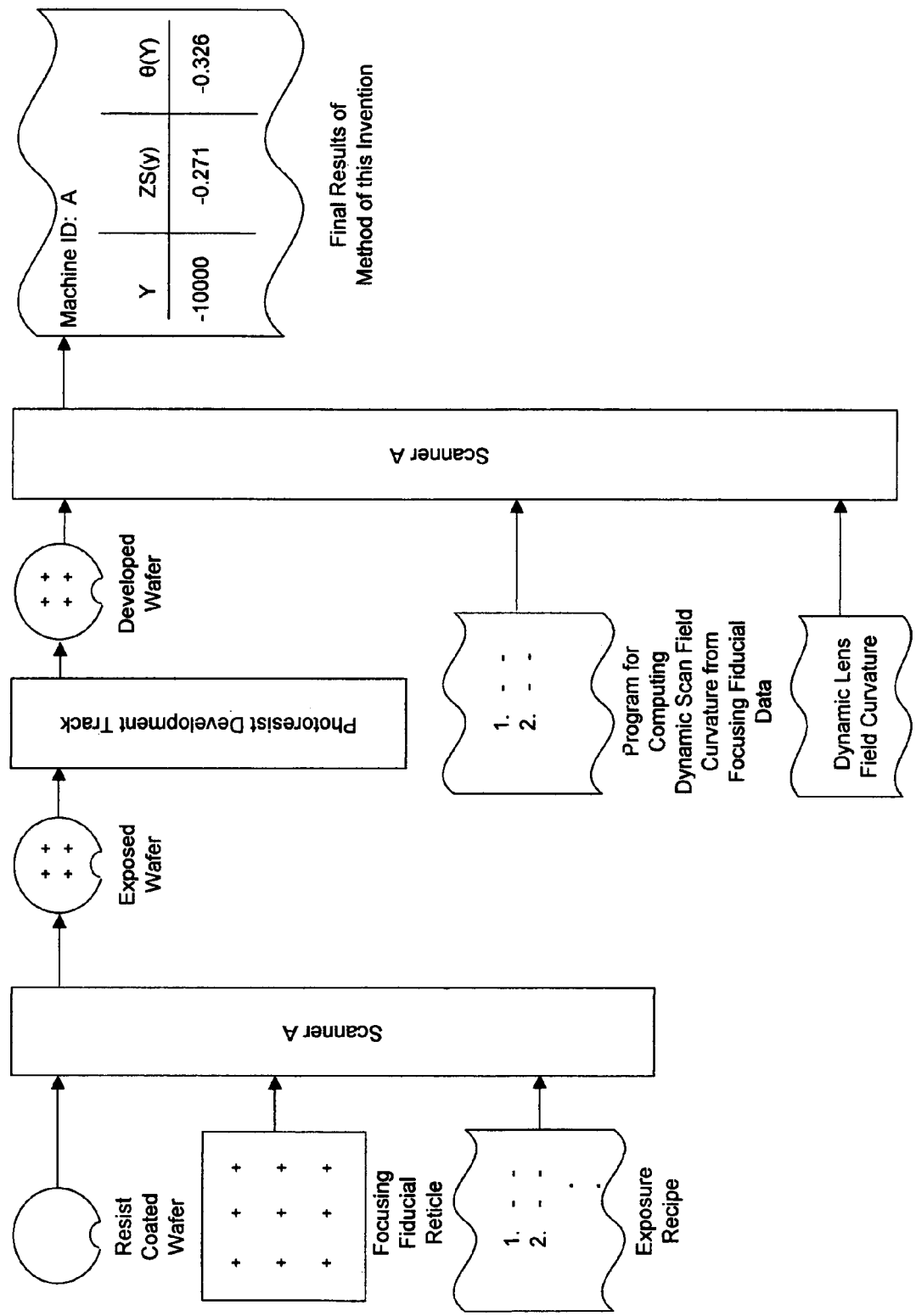
FIG. 24 is a block diagram illustrating a technique for processing the final output.

FIG. 24 is a block diagram illustrating a technique for processing the final output. As illustrated in FIG. 24, a resist coated wafer is loaded onto a scanner. In the example illustrated in FIG. 24 a scanner diagnoses itself for defects in dynamic scan field curvature. The dynamic scan field curvature information can then be used to correct the scanner, for example the scanner dynamic scan field curvature can be adjusted in response to the information. A reticle with focusing fiducials is also loaded onto the scanner. The scanner is then programmed to expose the focusing fiducials onto the wafer in accordance with a predetermined recipe from the method of this embodiment. After the wafer has the desired pattern exposed on it, the exposed wafer is sent through a photoresist track and developed. The developed wafer with the pattern of focusing fiducials is then loaded onto the scanner. The scanner is programmed to compute dynamic scan field curvature from the focusing fiducial data measured using the scanner (Scanner A in FIG. 24) and provided dynamic lens field curvature values. The scanner then outputs the ZS and θ values.

Figure 25:
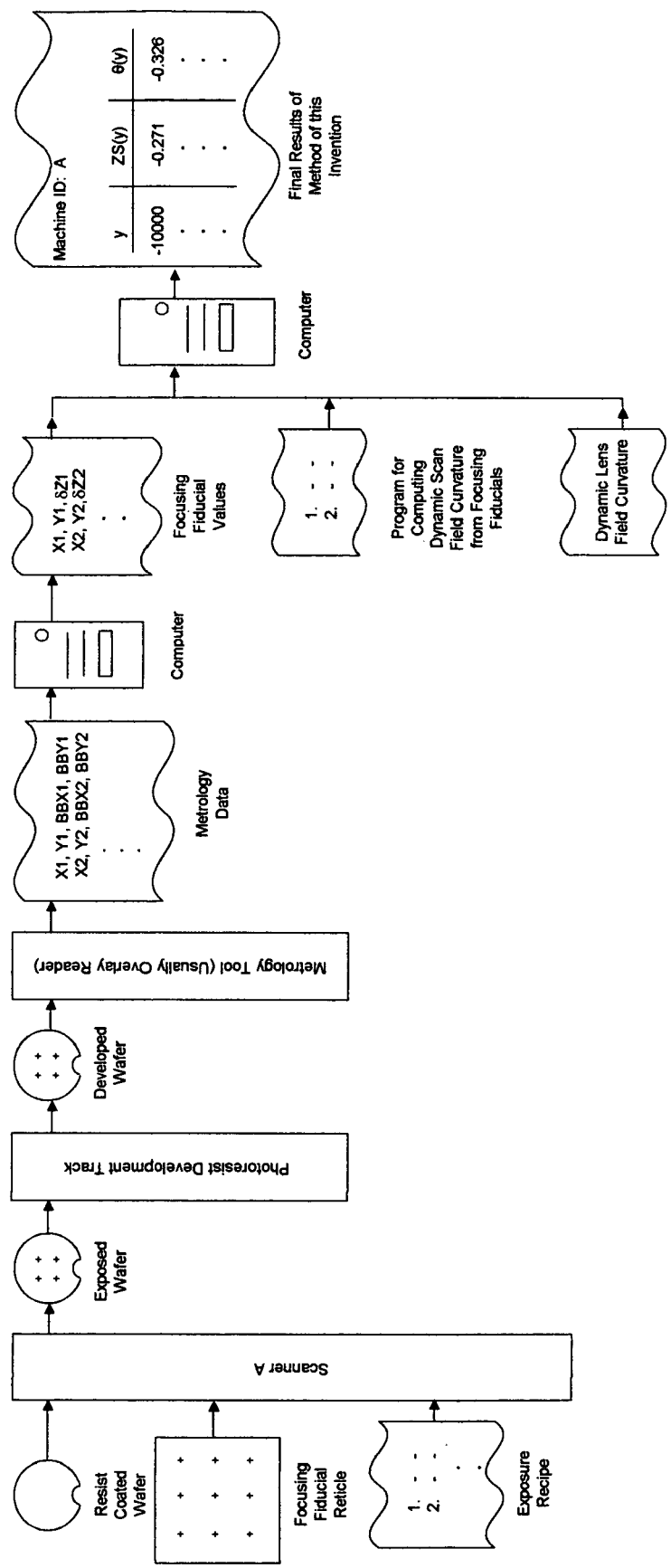
FIG. 25 is a block diagram illustrating another technique for processing the final output.

FIG. 25 is a block diagram illustrating another technique for processing the final output. In a manner similar to that described in FIG. 24, a resist coated wafer and a reticle with focusing fiducials are loaded onto a scanner. The focusing fiducials are then exposed onto the wafer in accordance with a predetermined recipe from the method of this embodiment. The exposed wafer is sent through a photoresist track and developed. In this technique, the developed wafer with the pattern of focusing fiducials is then loaded onto a metrology tool, such as an overlay reader. The metrology tool measures the developed fiducials and outputs metrology data that is fed into a processor or computer that converts the raw metrology data into focusing fiducial values. Another (or possibly the same) computer processes the focusing fiducial data and provided lens dynamic field curvature data to compute dynamic scan field curvature. This computer then outputs the ZS and θ values.

The present invention has been mainly described with respect to its application on the projection imaging tools (scanners) commonly used in semiconductor manufacturing today. See, for example, "Microscan™ III Performance of a Third Generation, Catadioptric Step and Scan Lithographic Tool", D. Cote et al., *SPIE*, Vol. 3051, pp. 806–816, 1997; "ArF Step and Scan Exposure System for 0.15 Micron and 0.13 Micron Technology Node", J. Mulkens et al., *SPIE Conference on Optical Microlithography XII*, pp. 506–521, March 1999; and "0.7 NA DUV Step and Scan System for 150 nm Imaging with Improved Overlay", J. V. Schoot, *SPIE*, Vol. 3679, pp. 448–463, 1999. The methods of the present invention can be applied to other scanning projection tools, such as 2-dimensional scanners. See, for example, "Large Area Fine Line Patterning by Scanning Projection Lithography", H. Muller et al., *MCM* 1994 *Proceedings*, pp. 100–104, 1994; and "Large-Area, High-Throughput, High-Resolution Projection Imaging System", K. Jain, U.S. Pat. No. 5,285,236 issued Feb. 8, 1994. Other scanning projection tools to which the invention can be applied include office copy machines. See, for example, "Projection Optical System for Use in Precise Copy", T. Sato et al., U.S. Pat. No. 4,861,148 issued Aug. 29, 1989. The invention also can be applied to next generation lithography (ngl) systems such as XUV, SCALPEL, EUV (Extreme Ultra Violet), IPL (Ion Projection Lithography), EPL (electron projection lithography), and X-ray. See, for example, "Development of XUV Projection lithography at 60–80 nm", B. Newnam et al., *SPIE*, Vol. 1671, pp. 419–436, 1992, (XUV); "Reduction Imaging at 14 nm Using Multilayer-Coated Optics: Printing of Features Smaller than 0.1 Micron", J. Bjorkholm et al, *Journal Vacuum Science and Technology*, B. 8(6), pp. 1509–1513, November/December 1990)(EUV); "Mix-and-Match: A Necessary Choice", R. DeJule, *Semiconductor International*, pp. 66–76, February 2000; and "Soft X-Ray Projection Lithography", N. Ceglio et al., *J. Vac. Sci. Technol.*, B 8(6), pp. 1325–1328. The present method can also be used with immersion lithography where the optical medium above the wafer has a refractive index significantly different from air (water for example).

The present invention has been mainly described with respect to the recording medium being positive photoresist. The present invention could equally well have used negative photoresist providing we make appropriate adjustment to the box-in-box structures on the reticle. In general, the recording medium is whatever is typically used on the lithographic projection tool we are measuring. Thus, on an EPL tool, an electron beam photoresist such as PMMA could be utilized as the recording medium. Thus, the recording media can be positive or negative photo resist material, electronic CCD or diode array liquid crystal or other optically sensitive material.

So far, we have described the substrates on which the recording media is placed as wafers. This will be the case in semiconductor manufacture. The exact form of the substrate will be dictated by the projection lithography tool and its use in a specific manufacturing environment. Thus, in a flat panel manufacturing facility, the substrate on which the recording material would be placed would be a glass plate or panel. A mask making tool would utilize a reticle as a substrate. Circuit boards or multi-chip module carriers are other possible substrates.

The techniques described can be used where the reticle, or mask, is a chrome patterned glass reticle containing arrays of alignment marks. In addition the reticle can be a SCALPEL or EUV reticle containing arrays of alignment marks or a reflective mask.

The focusing fiducial can take many forms. For example, the focusing fiducials can be electronic test patterns, box-in-box, frame-in-frame, or segment-in-segment patterns. The focusing fiducials can also be segmented bar-in-bar patterns, Schnitzl patterns, FOCAL patterns, PSFM patterns, or TIS alignment marks.

While the present invention has been described in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

We claim:

1. A method of determining dynamic scan field curvature associated with a photolithographic scanner having a projection lens, the method comprising:
    exposing an array of individually measurable focusing fiducials in a reticle of the scanner onto a substrate coated with a suitable recording media;
    rotating and realigning the substrate;
    exposing a second array of individually measurable focusing fiducials through the reticle, offset from the first exposed array of focusing fiducials by a predetermined position to produce a printed array of offset focusing fiducials; and
    calculating dynamic scan field curvature in accordance with measurements of the focusing fiducials and a dynamic lens field curvature map for the photolithographic scanner.

2. A method as defined in claim 1, wherein the array of focusing fiducials is a 2mx+1 by 2my+1 array.

3. A method as defined in claim 1, wherein the substrate is rotated 90 degrees.

4. A method as defined in claim 1, wherein the substrate is a semiconductor wafer.

5. A method as defined in claim 1, wherein the substrate is a flat panel display.

6. A method as defined in claim 1, wherein the substrate is a reticle.

7. A method as defined in claim 1, wherein the substrate is an electronic recording media.

8. A method of determining dynamic scan field curvature associated with a photolithographic scanner having a projection lens and a scanner field that is longer in the scan direction as compared with the across-field direction, the method comprising:
    exposing an array of individually measurable focusing fiducials in a reticle of the scanner onto a substrate coated with a recording media;
    rotating the substrate and realigning the substrate;
    exposing a second array of individually measurable focusing fiducials through the reticle to produce a printed array of focusing fiducials;
    shifting the substrate in a desired-direction by a desired amount;
    exposing a third array of individually measurable focusing fiducials through the reticle to produce a three-level printed array of focusing fiducials; and
    calculating dynamic scan field curvature in accordance with measurements of the focusing fiducials and a dynamic lens field curvature map for the photolithographic scanner.

9. A method as defined in claim 8, wherein the array of focusing fiducials is a 2mx+1 by 2my+1 array.

10. A method as defined in claim 8, wherein the substrate is rotated 90 degrees.

11. A method as defined in claim 8, wherein shifting the substrate is in an x-direction.

12. A method as defined in claim 8, wherein the substrate is shifted a distance equal to an integral multiple of a spacing pitch of the focusing fiducials.

13. A method as defined in claim 8, wherein the shifted substrate is offset by a desired amount.

14. A method as defined in claim 8, wherein the substrate is a semiconductor wafer.

15. A method as defined in claim 8, wherein the substrate is a flat panel display.

16. A method as defined in claim 8, wherein the substrate is a reticle.

17. A method as defined in claim 8, wherein the substrate is an electronic recording media.

18. An apparatus for determining dynamic scan field curvature of a photolithographic scanner, the apparatus comprising:
    a data interface that receives data taken from a developed substrate; and
    a processor configured to accept metrology data from the data interface wherein the data is obtained from measuring a substrate with exposed individually measurable focusing fiducials and dynamic lens field curvature data and to output dynamic scan field curvature in accordance with focal plane deviation values based on measurements of the focusing fiducials on the substrate.

19. The apparatus as defined in claim 18, wherein the substrate is a semiconductor wafer.

20. The apparatus as defined in claim 18, wherein the substrate is a flat panel display.

21. The apparatus as defined in claim 18, wherein the substrate is a reticle.

22. The apparatus as defined in claim 18, wherein the substrate is an electronic recording media.

23. A photolithographic projection scanner comprising:
a projection lens;
a reticle stage and a substrate carrier that can be positioned relative to each other; and
a processor that can control the projection scanner to position the reticle stage and substrate carrier in accordance with an exposure sequence, and adjust the scanner in accordance with measurements of individually measurable focusing fiducials exposed on the substrate and a dynamic lens field curvature map so as to minimize the dynamic lens field curvature of the scanner.

24. A scanner as defined in claim 23, whereby the measurements of the focusing fiducials are made on a measurement subsystem of the scanner.

25. A scanner as defined in claim 23, whereby the substrate carrier is a semiconductor wafer carrier.

26. A method of controlling a photolithographic projection scanner comprising:
exposing an array of individually measurable focusing fiducials in a reticle of the scanner onto a substrate coated with a suitable recording media;
rotating and realigning the substrate;
exposing a second array of individually measurable focusing fiducials through the reticle, offset from the first exposed array of focusing fiducials by a predetermined position to produce a printed array of offset focusing fiducials; and
determining dynamic scan field curvature in accordance with measurements of individually measurable focusing fiducials and a dynamic lens field curvature map for the photolithographic scanner; and
adjusting the scanner in accordance with the determined dynamic scan field curvature of the projection lens so as to minimize the effects of the dynamic scan field curvature of the scanner.

27. A method as defined in claim 26, whereby the substrate comprises a semiconductor wafer.

28. A method of manufacturing a semiconductor chip, the method comprising:
receiving dynamic scan field curvature of a projection lens used in a scanner the dynamic field curvature being independent of other dynamic focal errors; and
adjusting the scanner in accordance with the received dynamic scan field curvature of the projection lens so as to minimize the effects of dynamic scan field curvature of the scanner while exposing a semiconductor substrate.

29. A method as defined in claim 28, whereby the received dynamic scan field curvature is determined in accordance with measurement of focusing fiducials on a developed substrate and a dynamic lens field curvature map.

30. A method as defined in claim 29, whereby determining the dynamic scan field curvature further comprises:
exposing an array of focusing fiducials in a reticle of the scanner onto a substrate coated with a suitable recording media;
rotating and realigning the substrate;
exposing a second array of focusing fiducials through the reticle, offset from the first exposed array of focusing fiducials by a predetermined position to produce a printed array of offset focusing fiducials; and
calculating dynamic scan field curvature in accordance with measurements of the focusing fiducials and a dynamic lens field curvature map for the photolithographic scanner.

31. A method of determining dynamic scan field curvature associated with a photolithographic scanner having a projection lens, the method comprising:
exposing an array of individually measurable focusing fiducials in a reticle of the scanner onto a substrate coated with a suitable recording media;
rotating and realigning the substrate;
exposing a second array of individually measurable focusing fiducials through the reticle, offset from the first exposed array of focusing fiducials by a predetermined position to produce a printed array of offset focusing fiducials, wherein the offset between the first and second exposures is by an amount such that the substrate flatness over the shifted distance does not vary beyond a desired amount; and
calculating dynamic scan field curvature in accordance with measurements of the focusing fiducials and a dynamic lens field curvature map for the photolithographic scanner.

32. A method of determining dynamic scan field curvature associated with a photolithographic scanner having a projection lens and a scanner field that is longer in the scan direction as compared with the across-field direction, the method comprising:
exposing an array of individually measurable focusing fiducials in a reticle of the scanner onto a substrate coated with a recording media;
rotating the substrate and realigning the substrate;
exposing a second array of individually measurable focusing fiducials through the reticle to produce a printed array of focusing fiducials;
shifting the substrate in a desired-direction by a desired amount, wherein the shifted substrate is offset such that the substrate flatness over the shifted distance does not vary beyond a desired amount;
exposing a third array of individually measurable focusing fiducials through the reticle to produce a three-level printed array of focusing fiducials; and
calculating dynamic scan field curvature in accordance with measurements of the focusing fiducials and a dynamic lens field curvature map for the photolithographic scanner.

* * * * *